US008648429B2

(12) United States Patent
Kang et al.

(10) Patent No.: US 8,648,429 B2

(45) Date of Patent: Feb. 11, 2014

(54) SEMICONDUCTOR HAVING CHIP STACK, SEMICONDUCTOR SYSTEM, AND METHOD OF FABRICATING THE SEMICONDUCTOR APPARATUS

(75) Inventors: Uk-song Kang, Seongnam-si (KR); Hoon Lee, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 59 days.

(21) Appl. No.: 13/267,202

(22) Filed: Oct. 6, 2011

(65) Prior Publication Data

US 2012/0086125 A1 Apr. 12, 2012

(30) Foreign Application Priority Data

Oct. 6, 2010 (KR) ........................ 10-2010-0097423

(51) Int. Cl.
*H01L 51/10* (2006.01)

(52) U.S. Cl.
USPC .... 257/415; 257/416; 257/420; 257/E29.069; 257/E29.071

(58) Field of Classification Search
USPC .................. 257/738, 777, E23.085, 414–420, 257/E29.069, 29.07, 29.071; 438/109
See application file for complete search history.

(56) References Cited

U.S. PATENT DOCUMENTS

| | | | | |
|---|---|---|---|---|
| 8,063,455 | B2 * | 11/2011 | Kordus et al. | 257/415 |
| 2005/0173807 | A1 * | 8/2005 | Zhu et al. | 257/777 |
| 2006/0049528 | A1 * | 3/2006 | Kang et al. | 257/777 |
| 2008/0230888 | A1 * | 9/2008 | Sasaki | 257/686 |
| 2009/0021974 | A1 | 1/2009 | Nonomura et al. | |
| 2010/0265751 | A1 * | 10/2010 | Hong | 365/51 |
| 2011/0031600 | A1 * | 2/2011 | Kim | 257/686 |

FOREIGN PATENT DOCUMENTS

| | | |
|---|---|---|
| KR | 10-2006-0044637 | 5/2006 |
| KR | 10-2010-0026392 | 3/2010 |

* cited by examiner

*Primary Examiner* — Michael Lebentritt

(74) *Attorney, Agent, or Firm* — Muir Patent Consulting, PLLC

(57) ABSTRACT

In one embodiment, a semiconductor device includes a plurality of semiconductor chip stacks mounted on a substrate. Bonding terminals disposed on the substrate correspond to the chip stacks, such that at least one chip in each chip stack may be directly connected to a bonding terminal on the substrate and at least one chip in the chip stack is not directly connected to the bonding terminal. The semiconductor chip stacks may each act as one semiconductor device to the outside.

20 Claims, 19 Drawing Sheets

SEMICONDUCTOR HAVING CHIP STACK, SEMICONDUCTOR SYSTEM, AND METHOD OF FABRICATING THE SEMICONDUCTOR APPARATUS

CROSS-REFERENCE TO RELATED APPLICATIONS

This application claims the benefit of Korean Patent Application No. 10-2010-0097423, filed on Oct. 6, 2010, in the Korean Intellectual Property Office, the disclosure of which is incorporated herein in its entirety by reference.

BACKGROUND

The present disclosure relates to a semiconductor having a plurality of stacks of semiconductor chips in a stack structure, a semiconductor system and a method of fabricating the semiconductor.

Semiconductors popularly used in high-performance electronic systems have increased in terms of capacity and speed. There have been various attempts to include a higher-capacity memory into a smaller semiconductor and to operate the semiconductor faster.

To stack a plurality of semiconductor chip stacks in a single semiconductor device, a connection between the plurality of semiconductor chips in each chip stack or between the plurality of semiconductor chip stacks and the outside of the semiconductor may be complicated.

SUMMARY

In an exemplary embodiment, a semiconductor device comprises a substrate including at least a first conductive terminal disposed at a first surface of the substrate and a second conductive terminal disposed at the first surface of the substrate; at least a first set of two or more chips and a second set of one or more chips; the first set of two or more chips comprising a plurality of semiconductor chips including at least a first chip stacked on a second chip, the first chip including at least a first conductive terminal disposed at a first surface of the first chip; the second set of one or more chips comprising one or more semiconductor chips including at least a third chip, the third chip including at least a first conductive terminal disposed at a first surface of the third chip; a first node including the first conductive terminal of the first chip, the first conductive terminal of the substrate, and a bonding wire disposed between the two conductive terminals; a first through via passing through at least part of the first chip and electrically connected to the first node and the second chip; a second node including the first conductive terminal of the third chip, the second conductive terminal of the substrate, and a first conductive contact disposed between the two conductive terminals, wherein the first set of chips and second set of chips are mounted on the substrate such that the first set of chips is stacked on the second set of chips.

In an exemplary embodiment, a semiconductor device comprises a substrate; at least a first set of two or more chips and a second set of two or more chips mounted on the substrate; the first set of two or more chips comprising at least a first semiconductor chip configured to receive signals directly from the substrate, and at least a second semiconductor chip configured to receive signals transmitted from the substrate indirectly through the first semiconductor chip; the second set of two or more chips comprising at least a third semiconductor chip configured to receive signals directly from the substrate, and at least a fourth semiconductor chip configured to receive signals transmitted from the substrate indirectly through the third semiconductor chip, wherein the second set of chips is disposed on a first surface of the substrate, and the first set of chips is mounted on the second set of chips.

In an exemplary embodiment, a semiconductor device comprises a substrate including at least a first chip select terminal disposed at a first surface of the substrate and a second chip select terminal disposed at the first surface of the substrate; at least a first set of two or more chips and a second set of one or more chips; the first set of two or more chips comprising a plurality of semiconductor chips including at least a first chip stacked on a second chip, the first chip including at least a first conductive terminal disposed at a first surface of the first chip; the second set of one or more chips comprising one or more semiconductor chips including at least a third chip, the third chip including at least a first conductive terminal disposed at a first surface of the third chip; a first conductive contact connecting the first conductive terminal of the first chip to the first chip select terminal of the substrate; a first through via passing through at least part of the first chip and electrically connected to the first conductive contact and the second chip; a second conductive contact connecting the first conductive terminal of the third chip to the second chip select terminal of the substrate, wherein the first set of chips and the second set of chips are mounted on the substrate such that the first set of chips is stacked on the second set of chips.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

Figure 1A:
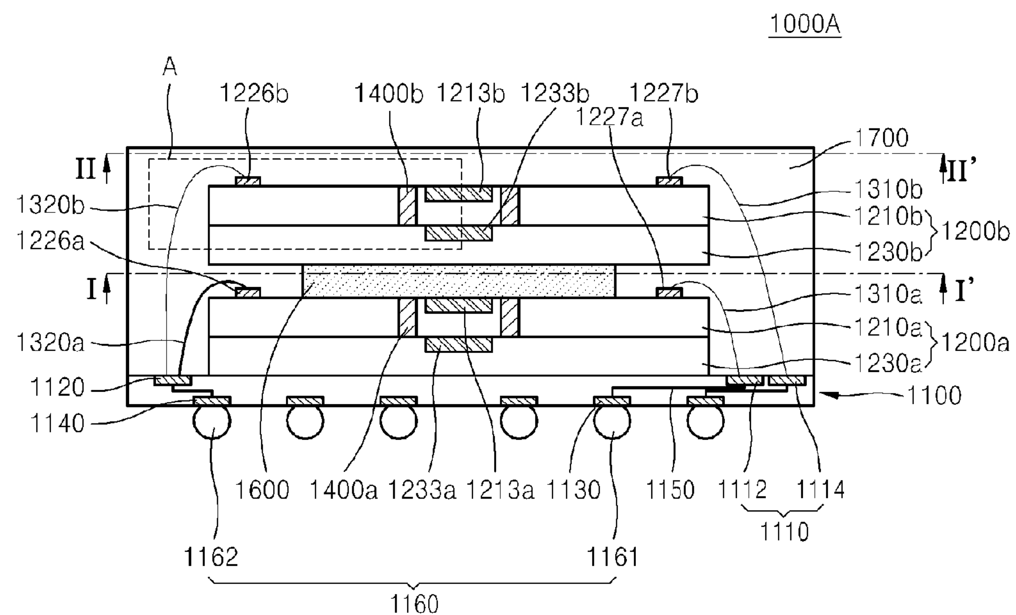
FIGS. 1A to 1E are cross-sectional views and a partially magnified view of a semiconductor apparatus according to an exemplary embodiment.

The present disclosure will be described below in more detail with reference to the accompanying drawings, in which various embodiments are shown. The invention may, however, be embodied in many different forms and should not be construed as limited to the embodiments stack forth herein. In the drawings, the sizes and relative sizes of layers and regions may be exaggerated for clarity of illustration. Like numbers refer to like elements throughout.

It will be understood that when an element or layer (or film) is referred to as being 'on' or 'connected to' to another element or layer or substrate, it can be directly on the other element or layer or substrate, or intervening elements or layers may also be present. In contrast, when an element is referred to as being 'in contact' or 'directly connected' to another element, there are no intervening elements present. As used herein, the term "and/or" includes any and all combinations of one or more of the associated listed items and may be abbreviated "/".

It will be understood that, although the terms first, second, etc., may be used herein to describe various elements, these elements should not be limited by these terms. Unless indicated otherwise, these terms are only used to distinguish one element from another element. For example, a first layer could be termed a second layer, and similarly, a second layer could be termed a first layer without departing from the teachings of the disclosure.

The terminology used herein is for the purpose of describing particular embodiments only and is not intended to be limiting of the invention. As used herein, the singular forms "a", "an", and "the" should not exclude the plural forms as well, unless the context clearly indicates otherwise. It will be further understood that the terms "comprises" and/or "comprising" or "includes" and/or "including" when used in this specification, specify the presence of stated features, regions, integers, steps, operations, elements and/or components, but do not preclude the presence of addition of one or more other features, regions, integers, steps, operations, elements, components and/or groups thereof.

Spatially relative terms, such as "beneath", "below", "lower", "above", "upper" and the like, may be used herein for ease of description to describe one element's or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features should still be considered to have such an orientation. Thus, the term "below" can encompass both an orientation of above and below. The device may be otherwise oriented (rotated 90 degrees or at other orientations) and the locational descriptors used herein interpreted in the same manner.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Unless otherwise defines, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art/or or the present application, and should not be interpreted in an idealized or overly formal sense unless expressly defined so herein.

Figure 1B:
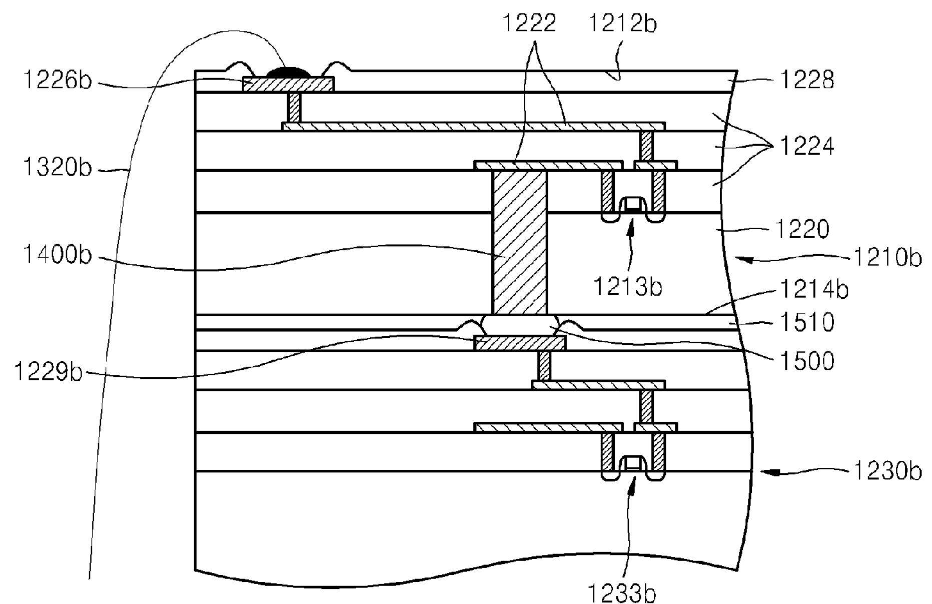
Figure 1C:
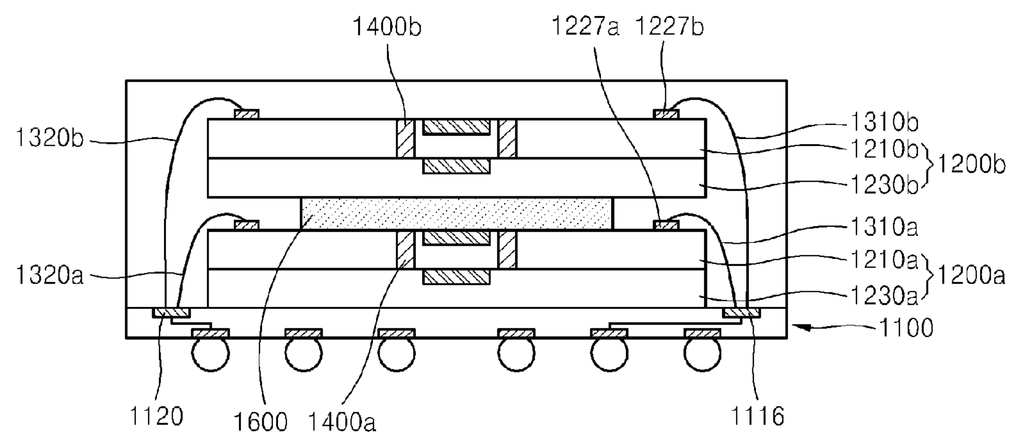
Figure 1D:
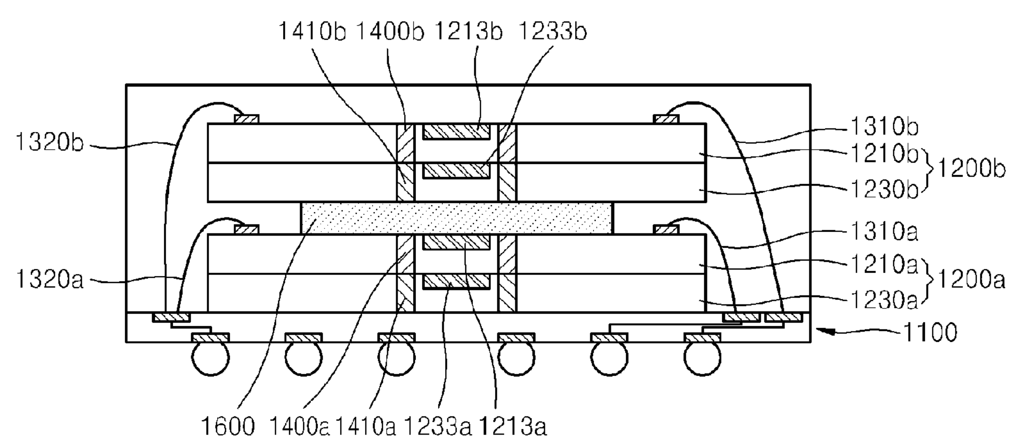
Figure 1E:
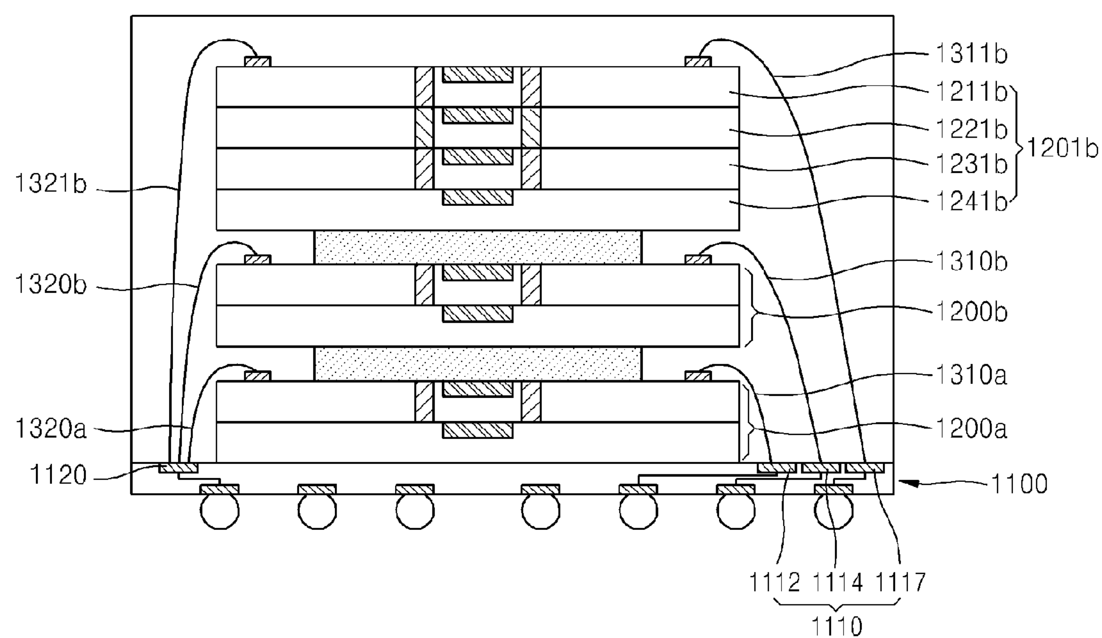
Figure 2A:
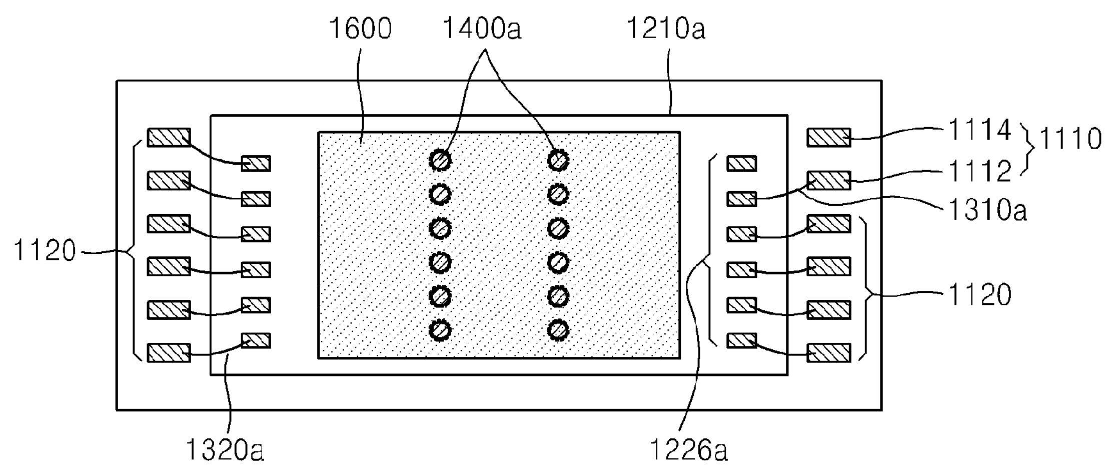
FIGS. 2A to 2D are top views of a semiconductor apparatus according to an exemplary embodiment.
Figure 2B:
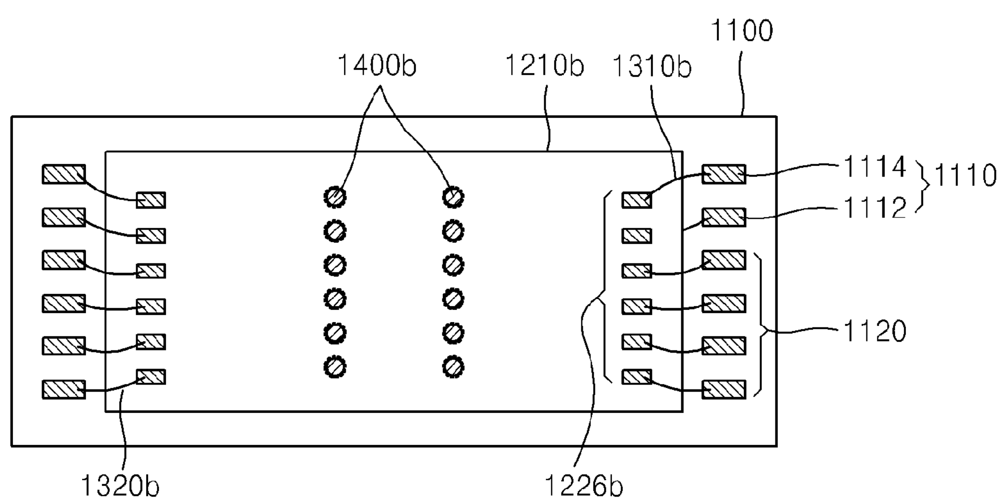

Hereinafter, exemplary embodiments will be described more fully with reference to the accompanying drawings FIGS. 1A to 1E are cross-sectional views and a partially magnified view of a semiconductor apparatus 1000A according to an exemplary embodiment, and FIGS. 2A and 2B are top views of the semiconductor apparatus 1000A shown in FIG. 1A.

Referring to FIG. 1A, the semiconductor apparatus 1000A includes a substrate 1100 and at least two chip stacks mounted on one surface of the substrate 1100. In one embodiment, a first chip stack is mounted on one surface of the substrate 1100 and a second chip stack is mounted on the first chip stack. In one embodiment, a third chip stack is mounted on the second chip stack. Although FIG. 1 shows for convenience of description a case where the semiconductor apparatus 1000A includes first and second chip stacks 1200*a* and 1200*b* having substantially the same configuration, the semiconductor apparatus 1000A may include three or more chip stacks, wherein each chip stack may have a various number or type of semiconductor chips. The first chip stack 1200*a* is an exemplary chip stack in the semiconductor apparatus 1000A. In one embodiment, the chip stack 1200*b* may have a similar configuration to chip stack 1200*a*. The first chip stack 1200*a* comprises one or more semiconductor chips stacked on each other. The first chip stack 1200*a* may comprise a set or a group of stacked semiconductor chips.

The semiconductor apparatus 1000A will now be described with reference to FIGS. 1A, 2A, and 2B. FIGS. 2A and 2B are top views through lines I-I' and II-II' in FIG. 1, respectively. FIG. 2A shows a top view of the first chip stack 1200*a*. FIG. 2B shows a top view of the second chip stack 1200*b*.

One or more bonding terminals may be disposed on the surface of the substrate 1100. In the exemplary embodiment depicted in FIG. 1A, a first bonding terminal group 1110 and a second bonding terminal group 1120 are disposed on a first surface of the substrate 1100. The first bonding terminal group 1110 includes one or more first bonding terminals (e.g. terminals 1112 and 1114). In one embodiment, the first bonding terminal group 1110 includes dedicated terminals, with each first bonding terminal connected to a separate stack of semiconductor chips. For example, the first bonding terminal group 1110 may include a first and a second chip select terminal 1112 and 1114, each delivering a chip select signal. The first chip select terminal 1112 may be connected and dedicated to the first chip stack and the second chip select terminal 1114 may be connected and dedicated to the second chip stack. In one embodiment, some of the first bonding terminals are shared terminals and some are dedicated terminals. In one embodiment, the first and second chip select terminals 1112 and 1114 select one of the plurality of chip stacks in the semiconductor apparatus 1000A. In another embodiment, the first and second chip select terminals 1112 and 1114 select a specific chip in one of the plurality of chip stacks in the semiconductor apparatus 1000A.

The second bonding terminal group 1120 includes one or more second bonding terminals. In one embodiment, the second bonding terminal group 1120 includes one or more second bonding terminals for delivering a control signal and/or a data signal. In one embodiment, the second bonding terminal group 1120 includes a shared terminal, such that each stack of semiconductor chips are bonded to the same terminal. In another embodiment, the second bonding terminal group 1120 may include several second bonding terminals that may comprise dedicated terminals, such that each second bonding terminal is connected to a separate semiconductor chip stack. The control signal may include, for example, a command signal and an address signal. In one embodiment, some of the second bonding terminals are shared terminals and some are dedicated terminals.

One or more access terminals may be disposed on a second surface of the substrate 1100, opposite of the surface on which the first and second bonding terminal groups 1110 and 1120 are disposed. An access terminal may be connected to a bonding terminal through a circuit pattern 1150 formed in the substrate 1100. In the exemplary embodiment depicted in FIG. 1A, a first access terminal 1130 connected to the first bonding terminal group 1110 and a second access terminal 1140 connected to the second bonding terminal group 1120 are disposed on the second surface of the substrate 1100. In one embodiment, the number of access terminals corresponds to the number of bonding terminals. In addition, one or more external access contacts 1160 (as shown also by individual external access contacts 1161, 1162) may be attached to the access terminals. In some embodiments, however, the number of access terminals may be higher than the number of bonding terminals. In one embodiment, each access terminal 1130, 1140 is connected to an external access contact, 1161, 1162, by which the semiconductor apparatus 1000A may communicate with the outside. The external access contacts 1160 may be implemented by means of, for example, a solder bump, a solder ball, or a lead. In addition, the substrate 1100 may be a Printed Circuit Board (PCB). The bonding terminals and the access terminals described above may be, for example, conductive pads including a metal or other conductive material electrically connected to transmit signals to or from the first and second chip stacks 1200*a* and 1200*b* or to or from an external device.

The location of the first and second bonding terminal groups 1110 and 1120 are not limited to the examples described herein and may be changed according to a function and/or location of a semiconductor chip included in the semiconductor apparatus 1000A. Further, the designation of the first and second bonding terminal groups 1110 and 1120 are not limited to the examples described herein. In one embodiment, one or both of the first bonding terminal group 1110 and the second bonding terminal group 1120 may include shared terminals and/or dedicated terminals.

In one embodiment, each chip stack includes at least two stacked semiconductor chips. For example, the first chip stack 1200*a* may include a plurality of semiconductor chips 1210*a* and 1230*a* in a stack structure. Although terms 'upper chip' and 'lower chip' may be interchangeable and may also vary in definition, for convenience of depiction, a chip closely disposed to the substrate 1100 may be referred to as the lower chip 1230*a*, and a chip disposed farther from the substrate 1100 than the lower chip 1230*a* may be referred to as the upper chip 1210*a*. Like the first chip stack 1200*a*, the second chip stack 1200*b* may also include an upper chip 1210*b* and a lower chip 1230*b*. Although FIG. 1A shows a case where the first chip stack 1200*a* includes two semiconductor chips, the first chip stack 1200*a* is not limited thereto and may include three or more semiconductor chips. When a certain chip stack includes three or more semiconductor chips, an upper chip may refer to the semiconductor chip farthest from the substrate 1100. In another embodiment, at least one of the plurality of chip stacks includes at least two semiconductor chips. In this embodiment, one or more of the chip stacks may only include one semiconductor chip or may include a plurality of semiconductor chips.

Each chip in the first and second chip stacks 1200*a* and 1200*b* may be disposed in various manners. For example, in the first chip stack 1200*a*, the upper chip 1210*a* may be mounted in a face-up orientation so that an activation surface faces away from the substrate 1100 or in a face-down orientation so that the activation surface faces the substrate 1100. The lower chip 1230*a* may be disposed in the same manner as the upper chip 1210*a* or in another manner. FIG. 1A shows an illustration of mounting each chip in the face-up orientation, and accordingly, circuit parts 1213*a*, 1233*a*, 1213*b*, and 1233*b* of the respective chips 1210*a*, 1230*a*, 1210*b*, and 1230*b* are disposed in an opposite direction to the substrate 1100. In one embodiment, when the upper chip 1210*a* and the lower chip 1230*a* are the same kind of chips, the lower chip 1230*a* is disposed directly below the upper chip 1210*a* so that the lower chip 1230*a* is not shown, as in FIG. 2B.

Each chip stack may be connected to the substrate 1100 via a conductive contact. In one embodiment, the conductive contact is a bonding wire. For example, bonding wires 1310*a* and 1320*a* connect the first chip stack 1200*a* to the substrate 1100 and bonding wires 1310*b* and 1320*b* connect the second chip stack 1200*b* to the substrate 1100. When the number of chip stacks of the semiconductor apparatus 1000A increases, the number of bonding wires included in the semiconductor apparatus 1000A may increase in proportion to the number of chip stacks.

The upper chip 1210*a* or 1210*b* of each chip stack may include one or more edge pads, for example, chip pads 1226*a*, 1227*a*, 1226*b* and 1227*b*, disposed on an edge area of the upper chips 1210*a* and 1210*b*. Referring to FIG. 2B, when the first chip stack 1200*a* and the second chip stack 1200*b* include the same kind of chips and have the same configuration, the chip pads 1226*a* and 1226*b*, and 1227*a* and 1227*b*, of the upper chips 1210*a* and 1210*b* of the first and second chip stacks 1200*a* and 1200*b* may be disposed in the same position.

A bonding wire may be selectively connected to any one of the plurality of chips in a chip stack. In one embodiment, the bonding wires 1310*a* and 1320*a* corresponding to the first chip stack 1200*a* electrically connect the upper chip 1210*a* of the first chip stack 1200*a* to the substrate 1100. In one embodiment, first bonding wire 1310*a* connects a first bonding terminal 1112 of the first bonding terminal group 1110 to a chip pad 1227*a* of the first chip stack 1200*a* to deliver a chip select signal, and second bonding wire 1320*a* connects a second bonding terminal of the second bonding terminal group 1120 to a chip pad 1226*b* of the first chip stack 1200*a* to deliver a control signal, a data signal, and/or power. Similarly, first bonding wire 1310*b* connects a first bonding terminal 1114 of the first bonding terminal group 1110 to a chip pad 1227*b* of the second chip stack 1200*b* to deliver a chip select signal and second bonding wire 1320*b* connects a second bonding terminal of the second bonding terminal group 1120 to a chip pad 1226*b* of the second chip stack 1200*b* to deliver a control signal, a data signal, and/or power.

In one embodiment, a node connects a chip stack to the substrate 1100. The node may include, for example, a chip select terminal disposed on the substrate 1100, a bonding wire, and a chip pad disposed on a chip stack. For example, the chip select terminal 1112, the bonding wire 1310*a* and the chip pad 1227*a* on the upper chip 1210*a* of the first chip stack 1200*a* may comprise a node. Similarly, an example node comprises chip select terminal 1114, bonding wire 1310*b* and chip pad 1227*b* on upper chip 1210*b* on the second chip stack 1200*b*.

Because the first bonding wire 1310*a* or 1310*b* for selecting a chip stack is disposed in correspondence with a chip stack, the number of first bonding wires 1310*a* and 1310*b* may be less than the total number of chips in the semiconductor apparatus 1000A. In one embodiment, the first bonding wire 1310*a* or 1310*b* delivers a chip select signal to one of the chips in one of the plurality of chip stacks. In another embodiment, the first bonding wire 1310*a* or 1310*b* delivers a chip select signal to one of the plurality of chip stacks. Because the second bonding wire 1320*a* of the first chip stack 1200*a* may be aligned with and disposed directly below the second bonding wire 1320*b* of the second chip stack 1200*b*, the second bonding wire 1320*a* may not be shown, as in FIG. 2B. Alternatively, when the first chip stack 1200*a* and the second chip stack 1200*b* include different kinds of chips or are stacked offset, the second bonding wire 1320*a* may be shown in a top view.

The first and second chip stacks 1200*a* and 1200*b* may include through-vias 1400*a* and 1400*b*, respectively. In one embodiment, the through-via 1400*a* is formed to penetrate a portion of or a whole semiconductor chip, and the upper and lower chips 1210*a* and 1230*a* in the first chip stack 1200*a* are electrically connected to each other via the through-via 1400*a*. For example, the through-via 1400*a* delivers a signal between the upper chip 1210*a* and the lower chip 1230*a*. As shown in FIG. 1A, the through-via 1400*a* may be formed in the upper chip 1210*a*. In one embodiment, a signal and/or power delivered to the upper chip 1210*a* via the first and second bonding wires 1310*a* and 1320*a* is delivered to the lower chip 1230*a* via the through-via 1400*a*. In one embodiment, a data signal, for example, of the lower chip 1230*a* is output to the outside via the through-via 1400*a* and the upper chip 1210*a*.

FIG. 1B is a magnified view of a portion A of FIG. 1A. For convenience of description, the upper chip 1210*b* of the second chip stack 1200*b* is described as an example.

Referring to FIGS. 1A and 1B, the upper chip 1210*b* includes a first surface 1212*b* and a second surface 1214*b* opposite from the first surface 1212*b*. In one embodiment, the first surface 1212*b* is an activation surface through which a circuit part is disposed, and the second surface 1214*b* is a back surface opposite to the activation surface. In one embodiment, the upper chip 1210*b* includes a semiconductor substrate 1220, a circuit part 1213*b* formed on one surface of the semiconductor substrate 1220, an internal wiring pattern 1222, an inter-layer insulation film 1224 covering the circuit part 1213*b* and the internal wiring pattern 1222, and the chip pad 1226*b* exposed to the outside. The chip pad 1226*b* connects the upper chip 1210*b* to the outside, and when the chip pad 1226*b* is disposed on an edge area of the upper chip 1210*b*, the chip pad 1226*b* may function as a bonding pad for connecting a bonding wire thereto. A passivation layer 1228 may be further formed to cover the upper chip 1210*b* while exposing the chip pad 1226*b*. The circuit part 1213*b* may include, for example, a memory circuit, a logic circuit, and/or a passive device, and the inter-layer insulation film 1224 may be formed by stacking a plurality of films including an insulation material.

The through-via 1400*b* may be formed to penetrate the semiconductor substrate 1220. As shown in FIG. 1B, when the through-via 1400*b* is a via-middle through substrate via, the through-via 1400*b* penetrates at least a portion of the inter-layer insulation film 1224 while penetrating the semiconductor substrate 1220. In one embodiment, the through-via 1400*b* is connected to the circuit part 1213*b* and/or the chip pad 1226*b* via the internal wiring pattern 1222. Although not shown, when the through-via 1400*b* is a via-first through substrate via, the through-via 1400*b* may not penetrate the inter-layer insulation film 1224 while penetrating the semiconductor substrate 1220. Alternatively, when the through-via 1400*b* is a via-last through substrate via, the through-via 1400*b* may penetrate both the semiconductor substrate 1220 and the inter-layer insulation film 1224 to be connected to the chip pad 1226*b*.

The through-via 1400*b* may be connected to the circuit part 1213*b* of the upper chip 1210*b* via a portion of the internal wiring pattern 1222. Alternatively, the through-via 1400*b* may be electrically connected to the circuit part 1213*b* and connected to the chip pad 1226*b* via another portion of the internal wiring pattern 1222, which is not connected to the circuit part 1213*b*.

The through-via 1400*b* may be exposed from the second surface 1214*b* of the upper chip 1210*b*. An exposed surface of the through-via 1400*b* may be connected to a chip pad 1229*b* of the lower chip 1230*b*. An access contact 1500 may be interposed between the through-via 1400*b* and the chip pad 1229*b* of the lower chip 1230*b*. The access contact 1500 may include, for example, a conductive bump, a conductive spacer, or a solder ball. An adherent layer 1510 may be further interposed between the upper chip 1210*b* and the lower chip 1230*b*.

As shown in FIG. 1A, when a plurality of semiconductor chips are stacked and the lower chip 1230*b* is disposed in a face-up orientation, the lower chip 1230*b* may not include a through-via. Alternatively, the lower chip 1230*b* may include a through-via (not shown). For example, when the lower chip 1230*b* is disposed in a face-down orientation, the lower chip 1230*b* may include a through-via (not shown) connected to the circuit part 1233*b* of the lower chip 1230*b*. As another example, when the upper chip 1210*b* and the lower chip 1230*b* are the same kind of chips, a through-via (not shown) formed the same as the through-via 1400*b* of the upper chip 1210*b* may be disposed in the lower chip 1230*b* regardless of its face-up or face-down orientation. As another example, when the second chip stack 1200*b* includes another semiconductor chip below the lower chip 1230*b*, a through-via (not shown) may be formed in the lower chip 1230*b* to be electrically connected to the other semiconductor chip.

Referring to FIG. 1A, the upper chips 1210*a* and 1210*b* and the lower chips 1230*a* and 1230*b* of the first and second chip stacks 1200*a* and 1200*b* may be disposed so that their activation surfaces are oriented in the same direction or in opposite directions. For example, referring to the first chip stack 1200*a*, when the upper chip 1210*a* is disposed in a face-up orientation, the circuit part 1213*a* of the upper chip 1210*a* may be connected to the substrate 1100 via the bonding wires 1310*a* and 1320*a* instead of via the through-via 1400*a*. As another example, when the upper chip 1210*a* is disposed in a face-down orientation and the lower chip 1230*a* is disposed in a face-up orientation, because the activation surfaces of the upper chip 1210*a* and the lower chip 1230*a* face each other, a high-speed communication between the upper chip 1210*a* and the lower chip 1230*a* may be achieved. The orientation of the upper chip 1210*b* and the lower chip 1230*b* in the second chip stack 1200*b* may be similar to that of the upper chip 1210*a* and the lower chip 1230*a* in the first chip stack 1200*a*.

In one embodiment, each chip stack may functionally operate as if it was a single semiconductor chip. For example, the first chip stack 1200*a* may operate as a single function unit, with the two or more semiconductor chips 1210*a* and 1230*a* being electrically connected to each other via the through-via 1400*a*. In one embodiment, each of the first and second chip stacks 1200*a* and 1200*b* includes a master chip and at least one slave chip. For example, the first chip stack 1200*a* includes one master chip, with the rest of the chips in the chip stack 1200*a* being slave chips. The master chip may include an interface circuit for interfacing with the outside. The one or more slave chips may operate as a bank group together with the master chip and may communicate with the outside via the master chip. Because the master chip may include a memory cell and various kinds of peripheral circuits for a memory operation, the master chip may have a larger size than that of the slave chip. Alternatively, the master chip and the slave chips may be formed using the same kind of chips, having the same layout and size, and may operate as a master chip or a slave chip according to a difference between the connection relationships of their internal circuits.

As another example, each of the first and second chip stacks 1200*a* and 1200*b* may include an interface chip and at least one core chip. The interface chip may communicate with an external controller, for example, and the core chips may transmit or receive data to or from the outside of the semiconductor apparatus 1000A via the interface chip. As another example, each of the first and second chip stacks 1200*a* and 1200*b* may include a logic chip and at least one memory chip. The memory chips may operate by a control signal generated by the logic chip.

In one embodiment, as mentioned above, each chip stack 1200*a* and 1200*b* includes a master chip and at least one slave chip. For example, the upper chip 1210*a* or 1210*b* may be a master chip and the lower chip 1230*a* or 1230*b* may be a slave chip. As discussed, the function of the chip stacks 1200*a* and 1200*b* are not limited thereto, and the upper chips 1210*a*, 1210*b* and the lower chips 1230*a*, 1230*b* may have the same or different sizes.

Because each chip stack may operate as a single function unit, even though a single chip stack includes a plurality of semiconductor chips, the single chip stack may receive a single chip select signal. The first and second chip stacks 1200*a* and 1200*b* may be selected by different chip select signals. According to a supply method of a chip select signal, the number of first bonding terminals in the first bonding terminal group 1110 and the number of first bonding wires 1310*a* and 1310*b* may vary.

Figure 2C:
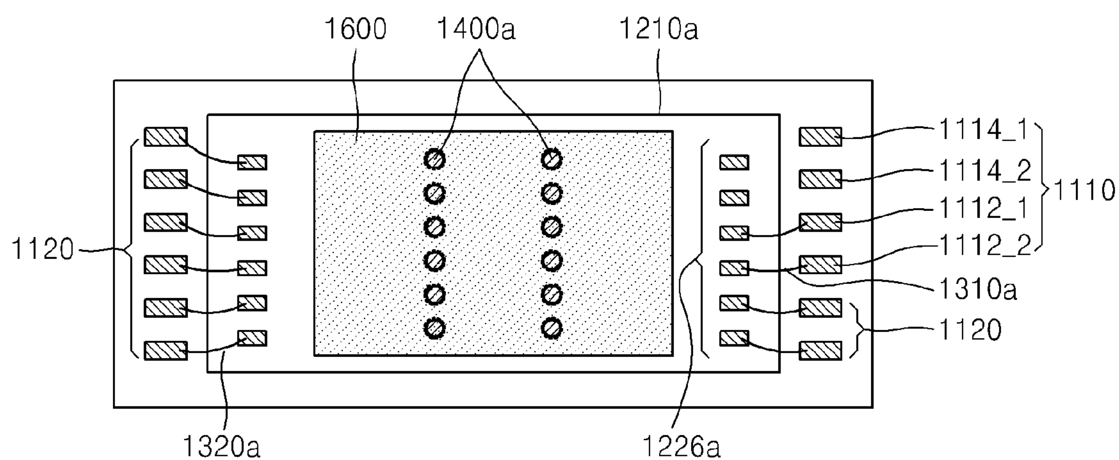
Figure 2D:
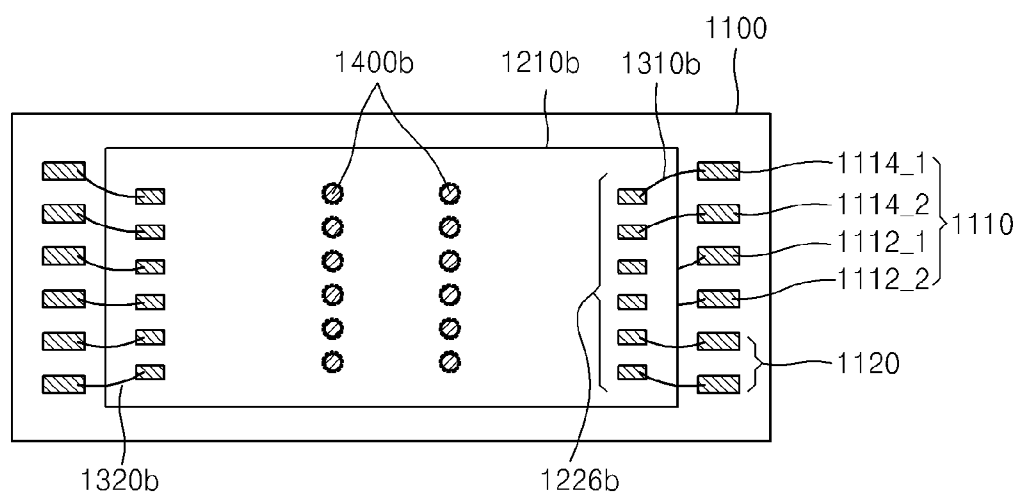

For example, the first and second chip stacks 1200*a* and 1200*b* may be connected to the first and second chip select terminals 1112 and 1114, respectively, as shown in FIG. 1A. As such, the first and second chip select terminals 1112 and 1114 are different chip select terminals for delivering individual chip select signals. In one embodiment, the first bonding wire 1310*a* of the first chip stack 1200*a* is connected to the first chip select terminal 1112 and the first bonding wire 1310*b* of the second chip stack 1200*b* is connected to the second chip select terminal 1114. In one embodiment, the first chip select terminal 1112 sends a select signal to select the first chip stack 1200*a*. In one embodiment, the first chip select terminal 1112 sends a select signal to select one of the semiconductor chips in the first chip stack 1200*a*. An example of this is shown in FIGS. 2D and 2C. The second chip select terminal 1114 may act in the same manner as the first chip select terminal 1112. The first and second chip select terminals 1112 and 1114 are disposed separate from each other for convenience of depiction, as shown in FIG. 2A. The first and second chip select terminals 1112 and 1114 may also be disposed to overlap with each other. The relative positions of the first and second chip terminals 1112 and 1114 are not limited to the examples described herein.

Both the second bonding wire 1320*a* of the first chip stack 1200*a* and the second bonding wire 1320*b* of the second chip stack 1200*b* may be connected to a shared terminal of the second bonding terminal group 1120. In one embodiment, the first and second chip stacks 1200*a* and 1200*b* share a control signal, a data signal, and/or power, and the determination of which one of the first and second chip stacks 1200*a* and 1200*b* operates may be controlled by a chip select signal. The semiconductor apparatus 1000A may include a smaller number of chip select terminals and/or a smaller number of first bonding wires 1310*a* and 1310*b* than the number of semiconductor chips in the semiconductor apparatus 1000A. The number of chip select terminals and/or the number of first bonding wires 1310*a* and 1310*b* may correspond to the number of chip stacks. In one embodiment, the number of chip select terminals and/or the number of first bonding wires 1310*a* and 1310*b* is the same as the number of chip stacks.

In one embodiment, a plurality of chips in the semiconductor apparatus 1000A are classified into at least two chip stacks, each chip stack being connected to the substrate 1100 via a conductive means, such as a wire, to communicate with the outside. A plurality of the chips in each chip stack may transmit and receive a signal to and from each other via one or more through-vias formed in the chip stack. In one embodiment, a through-via formed in any one of the at least two chip stacks is electrically insulated from a through-via formed in any other chip stack.

In one embodiment, because only one chip in each chip stack may be connected to the outside via a wire, when a signal is input or output via the wire, an input capacitance may be prevented from increasing as it might if each chip in the stack were connected to the outside. In one embodiment, an input/output load of the signal is decoupled. Because the through-vias formed in the different chip stacks may be electrically insulated from each other, the number of chips connected via each through-via may be reduced. The number of chip select terminals for selecting the chip stacks and/or the number of first bonding wires 1310*a* and 1310*b* may be proportional to the number of chip stacks in the semiconductor apparatus 1000A. The number of chip select terminals and/or the number of first bonding wires 1310*a* and 1310*b* may be equal to or less than the total number of chip stacks in the semiconductor apparatus 1000A. In one embodiment where only one first bonding wire connects each chip stack in a semiconductor apparatus to the substrate, the number of chip select terminals and/or the number of first bonding wires may be equal to or less than half the total number of chips in the semiconductor apparatus 1000A. For example, if two chip stacks each include two chips such that the total number of chips in the semiconductor apparatus 1000A is 4, as shown in FIG. 1A, the number of first bonding wires is 2, which is half the total number of chips. Alternatively, although not shown, if two chip stacks each include three chips such that the total number of chips in the semiconductor apparatus 1000A is 6, the number of first bonding wires may be 2, which is one-third the total number of chips.

In one embodiment as depicted in FIG. 1C, the first and second chip stacks 1200*a* and 1200*b* may be connected to a single chip select terminal 1116. The single chip select terminal 1116 is a shared terminal. For example, the first bonding wire 1310*a* of the first chip stack 1200*a* and first bonding wire 1310*b* of the second chip stack 1200*b* are connected to the chip select terminal 1116. In one embodiment, when a chip select signal supplied via the chip select terminal 1116 is a first logic signal, the first chip stack 1200*a* may be selected, and when the chip select signal supplied via the chip select terminal 1116 is a second logic signal, the second chip stack 1200*b* may be selected. In one embodiment, the semiconductor apparatus 1000A may include a smaller number of chip select terminals 1116 and/or a smaller number of first bonding wires 1310*a* and 1310*b* than the number of semiconductor chips in the semiconductor apparatus 1000A. In one embodiment, the number of chip select terminals 1116 and/or the number of first bonding wires 1310*a* and 1310*b* may be less than the number of chip stacks.

As another example, the first and second chip stacks 1200*a* and 1200*b* may be connected to a plurality of chip select terminals 1110 as shown in FIGS. 2C and 2D. FIG. 2C is a top view showing a connection relationship between the first chip stack 1200*a* and the plurality of chip select terminals in the first bonding terminal group 1110 (as shown by chip select terminals 1114_1, 1114_2, 1112_1, and 1112_2). FIG. 2D is a top view showing a connection relationship between the second chip stack 1200*b* and the plurality of chip select terminals in the first bonding terminal group 1110 (as shown by chip select terminals 1114_1, 1114_2, 1112_1, and 1112_2).

In one embodiment, when a chip select signal is provided as 2 bits, a chip select signal for selecting the first chip stack 1200*a* may be supplied to a plurality of first chip select terminals 1112_1 and 1112_2, and a chip select signal for selecting the second chip stack 1200*b* may be supplied to a plurality of second chip select terminals 1114_1 and 1114_2. In this embodiment, the chip select signal may be used to select one of the plurality of chips in one of the plurality of chip stacks. For example, the chip select terminal 1112_1 may select the upper chip 1210*a* in the first chip stack 1200*a* and the chip select terminal 1114_2 may select the lower chip 1230*b* in the second chip stack 1200*b*. Each of the chip select terminals (e.g. 1112_*a* and 1112_2) may be connected to the same semiconductor chip in a chip stack in this embodiment. The chip select terminal may select a chip other than the chip to which it is directly connected. For example, a chip select terminal may choose a chip other than the chip to which it is directly connected by wire to signal to the chip stack that it wants processing to be done by the chip it selected and/or the chip to which the chip select terminal is directly connected by wire. The number of chip select terminals 1116 and/or the number of first bonding wires 1310*a* and 1310*b* may increase in proportion to the number of chip stacks. In one embodiment, the semiconductor apparatus 1000A may include a multiplex MUX (not shown) for selecting a corresponding chip stack and/or a corresponding chip in a chip stack according to a chip select signal.

In one embodiment, a spacer 1600 is disposed between the first chip stack 1200*a* and the second chip stack 1200*b*. The spacer 1600 may provide a space so that the first and second bonding wires 1310*a* and 1320*a* connected to the first chip stack 1200*a* do not contact with the lower chip 1230*b* of the second chip stack 1200*b*. The spacer 1600 may include an insulation material and may include an adherent material to adhere the first chip stack 1200*a* to the second chip stack 1200*b*. In one embodiment, the spacer 1600 may include an adherent layer formed thicker than an adherent layer (not shown) between the first chip stack 1200*a* and the substrate 1100.

A molding part 1700 may be formed to cover at least a portion of the substrate 1100, the first chip stack 1200*a*, and the second chip stack 1200*b*. The molding part 1700 may protect the semiconductor apparatus 1000A from humidity, shock, etc., from the outside.

Although the semiconductor apparatus 1000A includes two chip stacks, namely, the first and second chip stacks 1200*a* and 1200*b*, the number of chip stacks in the semiconductor apparatus 1000A is not limited to the examples described herein. For example, the number of chip stacks in the semiconductor apparatus 1000A may be equal to or more than 3.

The number of semiconductor chips in a single chip stack may depend on a manufacturing yield. For example, the number of semiconductor chips in a single stack may correspond to an amount of through-vias that can be stably secured. When a plurality of chips are stacked, a chip stack may be formed with a number of through-vias and connected to a substrate via a wire. By stacking a plurality of chip stacks, the number of semiconductor chips in a single semiconductor apparatus 1000A may increase while the number of defective products may decrease. Because load-decoupling may be accomplished between chips connected via through-vias, an operation speed may increase. For example, when the semiconductor apparatus 1000A includes four chips, two chip stacks that each includes two chips may be formed, similar to the embodiment shown in FIG. 1A. If the two chip stacks are connected to a single bonding terminal with respective bonding wires, an input capacitance may be reduced by half in comparison to a case where four individual chips are connected to a single bonding terminal with respective bonding wires. Because chips connected via through-vias may share a Delay Locked Loop (DLL), an input/output circuit, etc., a duplicated circuit can be omitted, thereby reducing power consumption.

FIG. 1D is a cross-sectional view showing a modified embodiment of the semiconductor apparatus 1000A of FIG. 1A.

In one embodiment, as shown in FIG. 1D, the semiconductor apparatus 1000A includes a first chip stack 1200*a* and a second chip stack 1200*b* stacked on the substrate 1100. The first chip stack 1200*a* includes a plurality of chips, e.g., first and second chips 1210*a* and 1230*a*, and the second chip stack 1200*b* includes a plurality of chips, e.g., third and fourth chips 1210*b* and 1230*b*. The first chip stack 1200*a* is connected to the substrate 1100 via the bonding wires 1310*a* and 1320*a*, and the second chip stack 1200*b* is connected to the substrate 1100 via the bonding wires 1310*b* and 1320*b*.

In one embodiment, the chips in each chip stack transmit and receive to and from each other via a through-via. For example, a first group of through-vias 1400*a* and 1410*a* is formed in the first and second chips 1210*a* and 1230*a* of the first chip stack 1200*a*, respectively, and a second group of through-vias 1400*b* and 1410*b* is formed in the third and fourth chips 1210*b* and 1230*b* of the second chip stack 1200*b*, respectively. The first group of through-vias 1400*a* and 1410*a* is electrically insulated from the second group of through-vias 1400*b* and 1410*b*.

FIG. 1D shows an example embodiment in which the first, second, third, and fourth chips 1210*a*, 1230*a*, 1210*b*, and 1230*b* are disposed in a face-up orientation, and accordingly, the circuit parts 1213*a*, 1233*a*, 1213*b*, and 1233*b* of the respective first, second, third, and fourth chips 1210*a*, 1230*a*, 1210*b*, and 1230*b* are disposed in an opposite direction to the substrate 1100. The first chip stack 1200*a* is described herein as an example. The second chip stack 1200*b* may have a similar configuration and operation as the first chip stack 1200*a*.

Signals received via the bonding wires 1310*a* and 1320*a* may be provided to the circuit part 1213*a* of the first chip 1210*a* via a predetermined wiring line (not shown) and provided to the circuit part 1233*a* of the second chip 1230*a* via the through-via 1400*a* formed in the first chip 1210*a*. In one embodiment, the through-via 1410*a* formed in the second chip 1230*a* may be a dummy via through which no actual signal is delivered.

In one embodiment, when the first and second chips 1210*a* and 1230*a* of the first chip stack 1200*a* are disposed in a face-down orientation, signals received via the bonding wires 1310*a* and 1320*a* are provided to the circuit part 1213*a* of the first chip 1210*a* via a predetermined wiring line (not shown) and the through-via 1400*a* formed in the first chip 1210*a*. The signals are provided to the circuit part 1233*a* of the second chip 1230*a* via the through-via 1400*a* formed in the first chip 1210*a* and the through-via 1410*a* formed in the second chip 1230*a*.

As described above, when chips fabricated in the same process are included in a chip stack, a through-via may be formed in all the chips in the chip stack regardless of a face-up or face-down orientation.

FIG. 1E is a cross-sectional view showing a modified embodiment of the semiconductor apparatus 1000A of FIG. 1A where each chip stack has an increased number of chips. In the description of the semiconductor apparatus 1000A of FIG. 1E, because like reference numerals in FIGS. 1A and 1E denote like configurations and operations, a detailed description thereof is not provided.

As shown in FIG. 1E, the semiconductor apparatus 1000A may include a plurality of chip stacks, e.g., a first chip stack 1200*a*, a second chip stack 1200*b*, and a third chip stack 1201*b*, stacked on the substrate 1100. Two or more chips may be stacked in each of the first, second, and third chip stacks 1200*a*, 1200*b*, and 1201*b*. For example, FIG. 1E shows an example in which two chips are stacked in each of the first and second chip stacks 1200*a* and 1200*b*, and 4 chips 1211*b*, 1221*b*, 1231*b*, and 1241*b* are stacked in the third chip stack 1201*b*. In addition, a through-via for delivering a signal between the chips in each chip stack may be formed in each chip stack.

The semiconductor apparatus 1000A may include a conductive contact for connecting each chip stack to the substrate 1100. In one embodiment, the conductive contact may be implemented by a wire. A first bonding terminal group 1110, including one or more first bonding terminals for delivering a chip select signal, is disposed on the substrate 1100. A second bonding terminal group 1120, including one or more second bonding terminals for delivering a control signal and/or a data signal, may be disposed on the substrate 1100. The first, second, and third chip stacks 1200*a*, 1200*b*, and 1201*b* may be connected to first bonding terminals of the first bonding terminal group 1110 (e.g. chip select terminals) via first bonding wires 1310*a*, 1310*b*, and 1311*b* and to second bonding terminals of the second bonding terminal group 1120 via second bonding wires 1320*a*, 1320*b*, and 1321*b*, respectively. In one embodiment, the second bonding group 1120 may include only one shared second bonding terminal disposed on the substrate 1100. The first, second, and third chip stacks 1200*a*, 1200*b*, and 1201*b* may each be connected to the shared second bonding terminal. In another embodiment, the number of second bonding terminals in the second bonding terminal group 1120 may correspond to the number of chip stacks. In one embodiment, the number of first bonding terminals in the first bonding terminal group 1110 may correspond to the number of chip stacks. For example, the first chip stack 1200*a* may be connected to a first chip select terminal 1112 of the first bonding terminal group 1110 via the first bonding wire 1310*a*, the second chip stack 1200*b* may be connected to a second chip select terminal 1114 of the first bonding terminal group 1110 via the first bonding wire 1310*b*, and the third chip stack 1201*b* may be connected to a third chip select terminal 1117 of the first bonding terminal group 1110 via the first bonding wire 1311*b*. In one embodiment, the number of first bonding wires 1310*a*, 1310*b*, and 1311*b* and/or the number of first bonding terminals in the first bonding terminal group 1110 may be less than or proportional to the total number of semiconductor chips in the semiconductor apparatus 1000A. For example, one or more of the first bonding terminals in the first bonding terminal group 1110 may be shared, and one or more of the first bonding terminals in the first bonding terminal group 1110 may be dedicated. When a chip select terminal is disposed for each chip stack, the number of first bonding wires 1310*a*, 1310*b*, and 1311*b* and/or the number of chip select terminals 1112, 1114, and 1117 may be the same as the number of chip stacks 1200*a*, 1200*b*, and 1201*b* included in the semiconductor apparatus 1000A. In one embodiment, some of the second bonding terminals in the second bonding terminal group 1120 may comprise shared terminals and some of the second bonding terminals in the second bonding terminal group 1120 may comprise dedicated terminals.

Figure 3A:
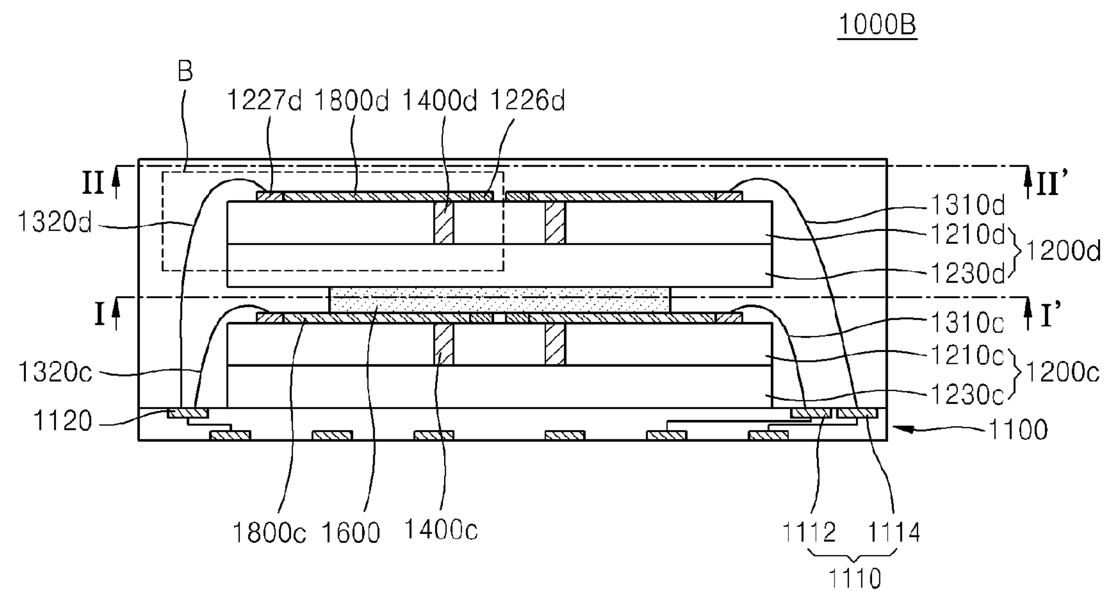
FIGS. 3A and 3B are a cross-sectional view and a partially magnified view of a semiconductor apparatus according to an exemplary embodiment.
Figure 3B:
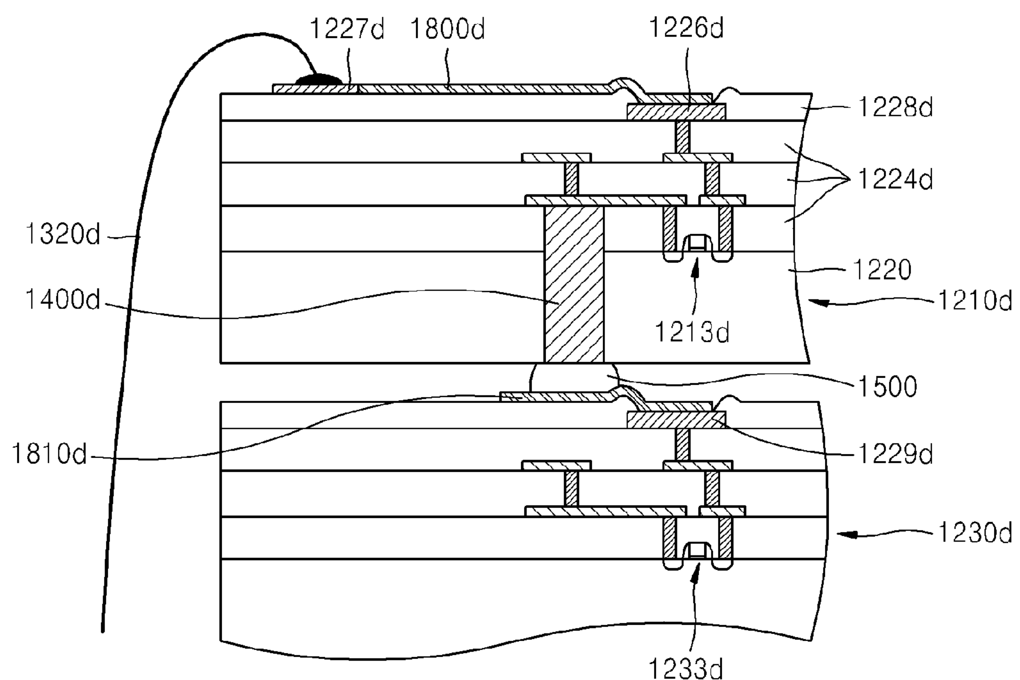
Figure 4A:
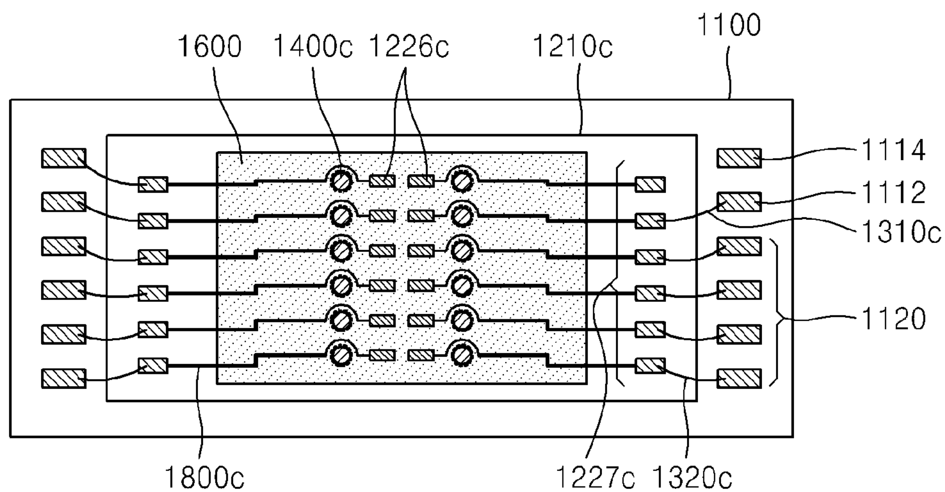
FIGS. 4A and 4B are top views of a semiconductor apparatus according to an exemplary embodiment.
Figure 4B:
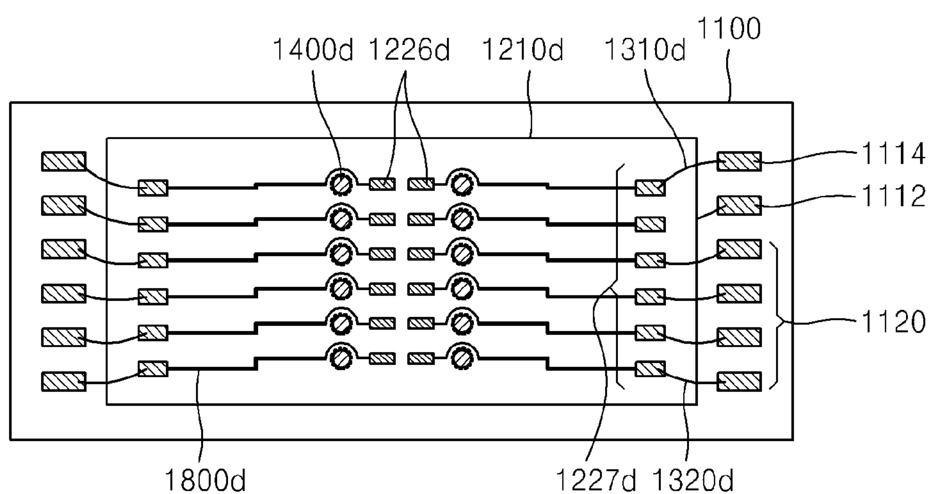

FIG. 3A is a cross-sectional view of a semiconductor apparatus 1000B according to an exemplary embodiment. FIG. 3B is a magnified view of a portion B of the semiconductor apparatus 1000B of FIG. 3A. FIGS. 4A and 4B are top views through lines I-I' and II-II' of the semiconductor apparatus 1000B of FIG. 3A, respectively.

In one embodiment, the semiconductor apparatus 1000B includes a first chip stack 1200*c* and a second chip stack 1200*d*. The first chip stack 1200*c* includes a plurality of chips 1210*c* and 1230*c* and a through-via 1400*c* that penetrates at least a portion or all of the plurality of chips 1210*c* and 1230*c*. The second chip stack 1200*d* includes a plurality of chips 1210*d* and 1230*d* and a through-via 1400*d* that penetrates at least a portion or all of the plurality of chips 1210*d* and 1230*d*. The first chip stack 1200*c* may be connected to the substrate 1100 via bonding wires 1310*c* and 1320*c*. The second chip stack 1200*d* may be connected to the substrate 1100 via bonding wires 1310*d* and 1320*d*. In one embodiment, rewiring lines 1800*c* and 1800*d* are disposed on the first and second chip stacks 1200*c* and 1200*d* of the semiconductor apparatus 1000B, respectively. For example, the rewiring line 1800*c* may be disposed on the upper chip 1210*c* of the first chip stack 1200*c*, and the rewiring line 1800*d* may be disposed on the upper chip 1210*d* of the second chip stack 1200*d*. Hereinafter, for convenience of description, a configuration of the second chip stack 1200*d* is described as an example, and a configuration different from that of the semiconductor apparatus 1000A of FIG. 1A is mainly described. The configuration of the first chip stack 1200*c* may be similar to that of the second chip stack 1200*d*.

Referring to FIGS. 3A and 4B, when a chip pad 1226*d* on the upper chip 1210*d* of the second chip stack 1200*d* is disposed in the center area of the upper chip 1210*d*, the rewiring line 1800*d* for connecting the chip pad 1226*d* to the bonding wires 1310*d* and 1320*d* may be formed on a first surface of the upper chip 1210*d*. For example, the rewiring line 1800*d* may extend towards edge areas of the upper chip 1210*d* from the chip pad 1226*d* and may be connected to a wire bonding pad 1227*d* connected to the bonding wires 1310*d* and 1320*d*.

In an embodiment depicted in FIG. 3B, the rewiring line 1800*d* is formed after forming a passivation layer 1228*d*. The rewiring line 1800*d* may include a metal pattern. For example, the rewiring line 1800*d* may be formed using copper, and a seed layer (not shown) may be disposed between the passivation layer 1228*d* and the rewiring line 1800*d*.

In one embodiment, rewiring line 1810*d* is formed on one surface of the lower chip 1230*d*. For example, when the upper chip 1210*d* and the lower chip 1230*d* are the same kind of chips, the lower chip 1230*d* may include a rewiring line (not shown) having the same pattern as that of the upper chip 1210*d*. As another example, in the embodiment shown in FIG. 3B, when a chip pad 1229*d* of the lower chip 1230*d* is not aligned with a through-via 1400*d* of the upper chip 1210*d*, the rewiring line 1810*d* may be formed to connect the chip pad 1229*d* of the lower chip 1230*d* to the through-via 1400*d* of the upper chip 1210*d*. In one embodiment, the rewiring line 1810*d* of the lower chip 1230*d* may be formed in a pattern different from the rewiring line 1800*d* of the upper chip 1210*d*.

FIGS. 4A and 4B show examples of patterns of the rewiring lines 1800*c* and 1800*d*. FIG. 4A is a top view of an example of the rewiring line 1800*c* of the first chip stack 1200*c*. FIG. 4B is a top view of an example of the rewiring line 1800*d* of the second chip stack 1200*d*. When the first chip stack 1200*c* and the second chip stack 1200*d* include the same kinds of chips, the rewiring line 1800*c* of the first chip stack 1200*c* may be implemented the same as the rewiring line 1800*d* of the second chip stack 1200*d*. A description is made with reference to FIG. 4B. According to the top view of FIG. 4B, the rewiring line 1800*d* may be formed so as to not overlap with the through-via 1400*d*.

The pattern of the rewiring line 1800*d* is not limited to the examples described herein and may vary according to a function of a semiconductor chip, a position of the through-via 1400*d*, and/or a position of the chip pad 1226*d*. For example, the rewiring line 1800*d* may be formed to overlap with the through-via 1400*d* in a vertical direction. Even though the rewiring line 1800*d* may be formed on the through-via 1400*d*, an inter-layer insulation film 1224*d* and/or the passivation layer 1228*d* may be interposed between the rewiring line 1800*d* and the through-via 1400*d*, as shown in FIG. 3B, such that the rewiring line 1800*d* and the through-via 1400*d* may not be electrically connected to each other. A rewiring line is not limited as depicted here, and may differ in semiconductor apparatuses according to various embodiments.

Figure 5:
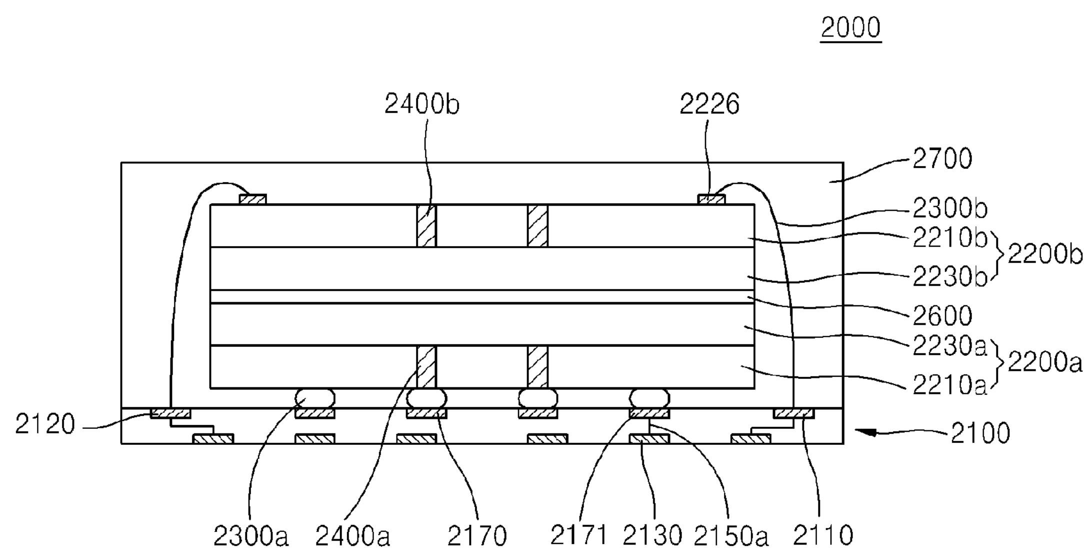
FIG. 5 is a cross-sectional view of a semiconductor apparatus according to an exemplary embodiment.

FIG. 5 is a cross-sectional view of a semiconductor apparatus 2000 according to an exemplary embodiment. The semiconductor apparatus 2000 includes a first chip stack 2200*a* and a second chip stack 2200*b* mounted on a substrate 2100. In one embodiment, the first chip stack 2200*a* includes a plurality of semiconductor chips, namely, first and second semiconductor chips 2210*a* and 2230*a*, connected via a through-via 2400*a*. The second chip stack 2200*b* includes a plurality of semiconductor chips, namely, third and fourth semiconductor chips 2210*b* and 2230*b*, connected via a through-via 2400*b*. The substrate 2100 and the first and second chip stacks 2200*a* and 2200*b* may include substantially the same configuration as the substrate 1100 and the first and second chip stacks 1200*a* and 1200*b* of FIG. 1A. Hereinafter, a configuration different from the semiconductor apparatus 1000A is mainly described.

The first and second chip stacks 2200*a* and 2200*b* may be connected to the substrate 2100 in different methods. In one embodiment, the first chip stack 2200*a* is connected to the substrate 2100 via a first conductive means 2300*a*, and the second chip stack 2200*b* is connected to the substrate 2100 via a second conductive means 2300*b*. For example, the first conductive means 2300*a* may be a flip-chip conductive means, and the second conductive means 2300*b* may be a wire bonding means. The flip-chip conductive means may include one selected from, for example, a conductive bump, a conductive spacer, a solder ball, and a group made by combining them and may be disposed as a grid array.

Referring to FIG. 5, each of the first and second chip stacks 2200*a* and 2200*b* may include at least two semiconductor chips connected via the respective through-via 2400*a* or 2400*b*. In one embodiment, the first chip stack 2200*a* includes first and second semiconductor chips 2210*a* and 2230*a* both mounted in a face-down orientation. In one embodiment, the first semiconductor chip 2210*a* is connected to the substrate 2100 via the first conductive contact 2300*a*, and the second semiconductor chip 2230*a* is stacked on the first semiconductor chip 2210*a*.

In addition to first bonding terminal group 2110 and second bonding terminal group 2120, a third bonding terminal group 2170 may be disposed on the substrate 2100. The third bonding terminal group 2170 may be include one or more third bonding terminals disposed in a mounting area of the first semiconductor chip 2210*a* for delivering a signal and/or power to the first chip stack 2200*a*. For example, the third bonding terminal group 2170 may include a first chip select terminal 2171 for selecting the first chip stack 2200*a*.

The through-via 2400*a* may penetrate at least a portion of the first semiconductor chip 2210*a*. The first semiconductor chip 2210*a* may be electrically connected to the second semiconductor chip 2230*a* via the through-via 2400*a*. The signal and/or power delivered to the first semiconductor chip 2210*a* via the first conductive contact 2300*a* may be forwarded to the second semiconductor chip 2230*a* via the through-via 2400*a*. As such, nodes that each include a terminal of the third terminal bonding group 2170, a conductive contact 2300*a* and a pad or a terminal surface of a through-via may connect the substrate 2200 to the bottom chip 2210*a* of the first chip stack 2200*a*.

The second chip stack 2200*b* includes the third and fourth semiconductor chips 2210*b* and 2230*b*. The third and fourth semiconductor chips 2210*b* and 2230*b* may be disposed on the first chip stack 2200*a* in a face-up orientation. The second chip stack 2200*b* may be substantially the same as the second chip stack 1200*b* of FIG. 1A, and the third and fourth semiconductor chips 2210*b* and 2230*b* may correspond to the upper chip 1210*b* and the lower chip 1230*b* of the second chip stack 1200*b* of FIG. 1A. The third semiconductor chip 2210*b* may be electrically connected to the substrate 2100 via the second conductive contact 2300*b*. The second conductive contact 2300*b* for connecting the second chip stack 2200*b* and the substrate 2100 may be implemented in a different manner from the first conductive contact 2300*a*. In one embodiment, the second conductive contact 2300*b* may be implemented by a wire, as shown in FIG. 5. The third and fourth semiconductor chips 2210*b* and 2230*b* may be the same kinds of chips or different kinds of chips from the first and second semiconductor chips 2210*a* and 2230*a*.

In one embodiment, an adherent layer 2600 is disposed between the first chip stack 2200*a* and the second chip stack 2200*b*. The first chip stack 2200*a* and the second chip stack 2200*b* may be adhered to each other by the adherent layer 2600. For example, one surface of the second semiconductor chip 2230*a* and one surface of the fourth semiconductor chip 2230*b* may be adhered to each other by the adherent layer 2600. The thickness of the adherent layer 2600 may be thinner than that of the spacer 1600 of FIG. 1A.

In one embodiment, the semiconductor apparatus 2000 includes a molding part 2700 covering at least a portion of the substrate 2100, the first chip stack 2200*a*, and the second chip stack 2200*b*. The molding part 2700 may include a configuration that is substantially the same as the molding part 1700 of FIG. 1A.

Because the first chip stack 2200*a* is connected to the substrate 2100 via the first conductive contact 2300*a*, this may allow a shorter path and a higher-speed operation to the first chip stack 2200*a* than a case where the first chip stack 2200*a* is connected to the substrate 2100 via the second conductive contact 2300*b* (e.g. a wire). For example, when the first semiconductor chip 2210*a*, e.g., a logic chip, and the second semiconductor chip 2230*a*, e.g., a wide Input/Output (I/O) memory chip, need to operate in a higher speed than other semiconductor chips, the higher-speed operation may be achieved through a configuration similar to that depicted in FIG. 5.

Figure 6A:
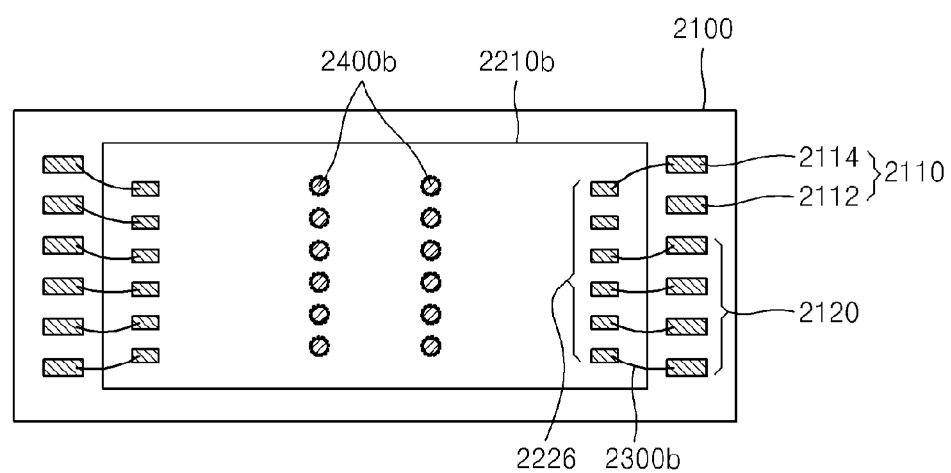
FIGS. 6A and 6B are top views of a semiconductor apparatus according to an exemplary embodiment.
Figure 6B:
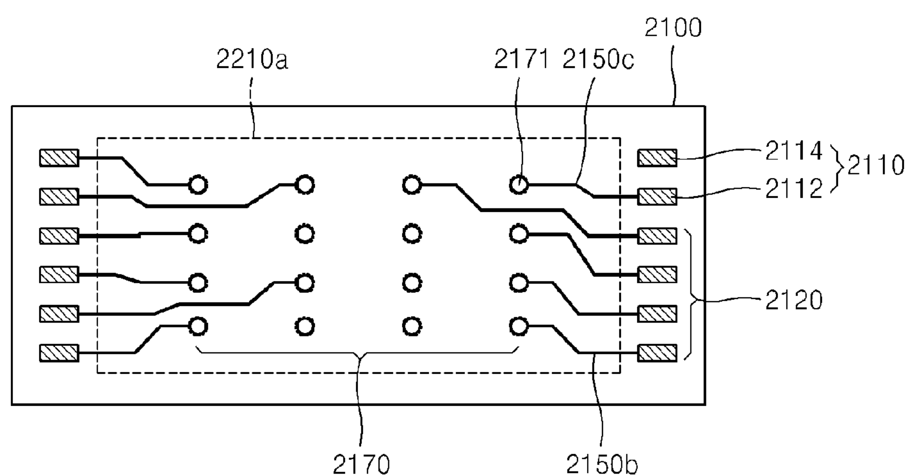

FIG. 6A is a top view of the semiconductor apparatus 2000 of FIG. 5. FIG. 6B is a top view of the substrate 2100 included in the semiconductor apparatus 2000 of FIG. 5.

Referring to FIG. 6A, the substrate 2100 and the third semiconductor chip 2210*b* disposed in the uppermost position are shown. In this embodiment, a chip pad 2226 of the third semiconductor chip 2210*b* may be connected to the first and second bonding terminal groups 2110 and 2120 via the second conductive contact 2300*b*. The first bonding terminal group 2110 may include one or more chip select terminals for delivering a signal for selecting a chip stack. For example, first bonding terminal group 1110 may include a chip select terminal 2112 connected to the first chip stack 2200*a* and a chip select terminal 2114 connected to the second chip stack 2200*b*. In the current embodiment, when the first chip stack 2200*a* directly receives a chip select signal from the first chip select terminal 2171 included in the third bonding terminal 2170, the chip select terminal 2112 may be omitted. The second bonding terminal group 2120 may include one or more second bonding terminals for delivering data and/or power, which may be shared by or dedicated to the first and second chip stacks 2200*a* and 2200*b* to deliver a signal.

Referring to FIG. 6B, the third bonding terminal group 2170 may be connected to the second bonding terminal group 2120 via a circuit pattern 2150*b* of the substrate 2100. The first semiconductor chip 2210*a* and the third semiconductor chip 2210*b* may share a signal and/or power delivered via the second bonding terminals in the second bonding terminal group 2120. The third bonding terminal group 2170 may include the first chip select terminal 2171, and the first chip select terminal 2171 may be connected to an access terminal 2130 via the circuit pattern 2150*a* as shown in FIG. 5. Alternatively, the first chip select terminal 2171 may be connected to the chip select terminal 2112 of the first bonding terminal group 2110 outside a first semiconductor chip mounting area via a circuit pattern 2150*c*, as shown in FIG. 6B.

Figure 7A:
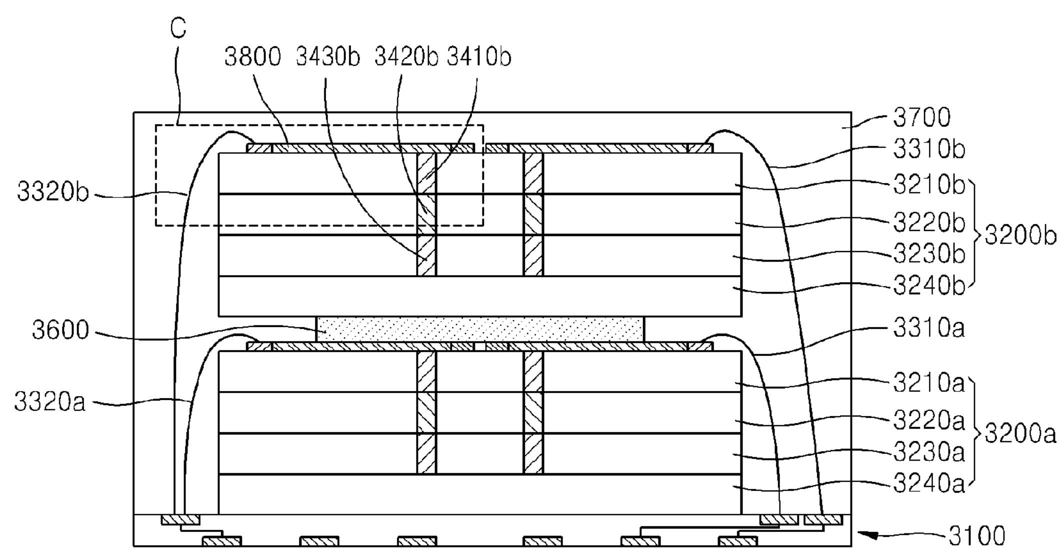
FIGS. 7A and 7B are a cross-sectional view and a partially magnified view of a semiconductor apparatus according to an exemplary embodiment.
Figure 7B:
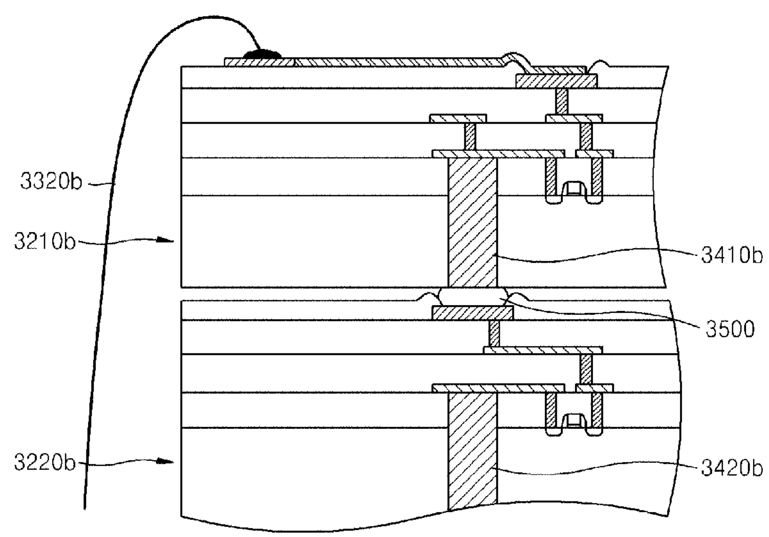

FIG. 7A is a cross-sectional view of a semiconductor apparatus 3000A according to an exemplary embodiment. FIG. 7B is a magnified view of a portion C of the semiconductor apparatus 3000A of FIG. 7A.

In one embodiment, the semiconductor apparatus 3000A includes at least one chip stack, and each chip stack includes three or more semiconductor chips. For example, as shown in FIG. 7A, the semiconductor apparatus 3000A may include first and second chip stacks 3200*a* and 3200*b* mounted on a substrate 3100. The first chip stack 3200*a* may include 4 semiconductor chips, namely, first, second, third, and fourth semiconductor chips 3210*a*, 3220*a*, 3230*a*, and 3240*a*. The second chip stack 3200*b* may include 4 semiconductor chips, namely, first, second, third, and fourth semiconductor chips 3210*b*, 3220*b*, 3230*b*, and 3240*b*. First and second bonding wires 3310*a* and 3320*a* for connecting the first chip stack 3200*a* to the outside may be disposed for communication between the first chip stack 3200*a* and the outside. First and second bonding wires 3310*b* and 3320*b* for connecting the second chip stack 3200*b* to the outside may be disposed for communication between the second chip stack 3200*b* and the outside. The first, second, third, and fourth semiconductor chips 3210*a*, 3220*a*, 3230*a*, and 3240*a* included in the first chip stack 3200*a* may be electrically connected to each other via corresponding through-vias. The first, second, third, and fourth semiconductor chips 3210*b*, 3220*b*, 3230*b*, and 3240*b* included in the second chip stack 3200*b* may be electrically connected to each other via corresponding through-vias.

The substrate 3100 and the first and second chip stacks 3200*a* and 3200*b* may correspond to the substrate 1100 and the first and second chip stacks 1200*a* and 1200*b* of FIG. 1A, respectively. Hereinafter, a configuration different from that of the semiconductor apparatus 1000B of FIG. 3A is mainly described with the second chip stack 3200*b* as an example. The first chip stack 3200*a* may be configured similarly to the second chip stack 3200*b*.

In one embodiment, the second chip stack 3200*b* includes the first, second, third, and fourth semiconductor chips 3210*b*, 3220*b*, 3230*b*, and 3240*b*. The fourth to first semiconductor chips 3240*b*, 3230*b*, 3220*b*, and 3210*b* may be sequentially stacked in a direction away from the substrate 3100. For example, the fourth semiconductor chip 3240*b* may be disposed closest to the substrate 3100, and the first semiconductor chip 3210*b* may be disposed farthest from the substrate 3100. The fourth semiconductor chip 3240*b* and the first semiconductor chip 3210*b* may have a configuration that is substantially the same as that of the upper chip 1210*d* and the lower chip 1230*d* shown in FIG. 3A, respectively.

The first semiconductor chip 3210*b* may include a first through-via 3410*b*. The first through-via 3410*b* may have a configuration that is substantially the same as that of the through-via 1400*d* included in the semiconductor apparatus 1000B of FIG. 3A. In one embodiment, the semiconductor apparatus 3000A includes a rewiring line 3800, similar to the semiconductor apparatus 1000B of FIG. 3A.

The second and third semiconductor chips 3220*b* and 3230*b* disposed between the first and fourth semiconductor chips 3210*b* and 3240*b* may include second and third through-vias 3420*b* and 3430*b*, respectively. The first, second, third, and fourth semiconductor chips 3210*b*, 3220*b*, 3230*b*, and 3240*b* may be electrically connected to each other via the first, second, and third through-vias 3410*b*, 3420*b*, and 3430*b*.

Referring to FIGS. 7A and 7B, the first through-via 3410*b* may be connected to the second semiconductor chip 3220*b*. A signal and/or power delivered to the first semiconductor chip 3210*b* via the second bonding wire 3320*b* may be forwarded to the second semiconductor chip 3220*b* via the first through-via 3410*b*. A signal and/or power needed to operate the third semiconductor chip 3230*b* may be delivered to the third semiconductor chip 3230*b* via the second bonding wire 3320*b*, the first through-via 3410*b*, and the second through-via 3420*b*. A signal and/or power needed to operate the fourth semiconductor chip 3240*b* may be delivered to the fourth semiconductor chip 3240*b* via the second bonding wire 3320*b*, the first through-via 3410*b*, the second through-via 3420*b*, and the third through-via 3430_b_. Likewise, a data signal of each of the first, second, third, and fourth semiconductor chips 3210_b_, 3220_b_, 3230_b_, and 3240_b_ may be read from the outside via a like path.

The semiconductor apparatus 3000A may include a molding part 3700 covering at least a portion of a spacer 3600 disposed between the first and second chip stacks 3200_a_ and 3200_b_. In one embodiment, the molding part 3700 may cover at least a portion of the substrate 3100 and the first and second chip stacks 3200_a_ and 3200_b_. The spacer 3600 and the molding part 3700 may have a configuration that is substantially the same as that of the spacer 1600 and the molding part 1700 of FIG. 1A.

Figure 8:
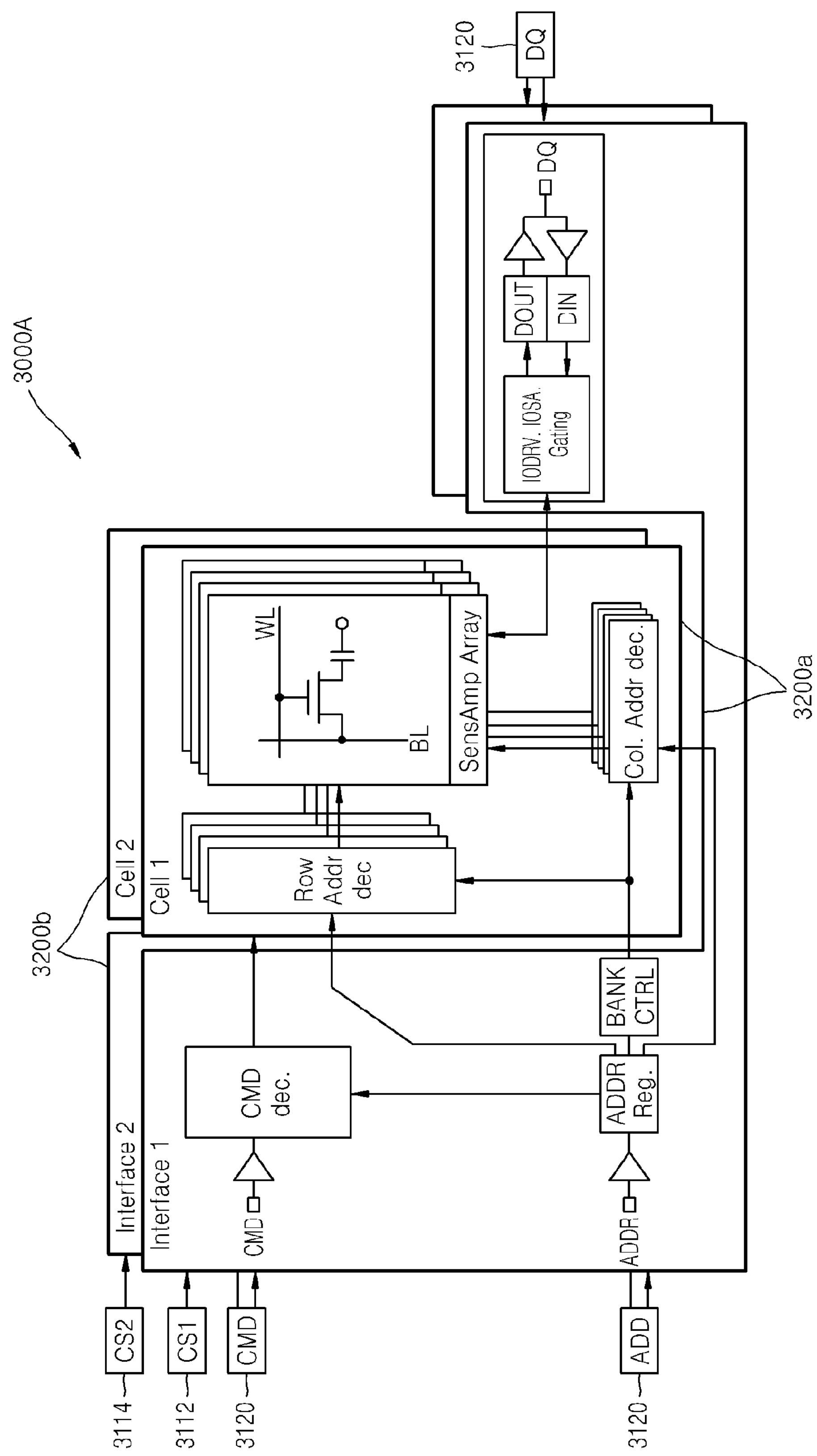
FIG. 8 is a block diagram of the semiconductor apparatus shown in FIG. 7A, according to an exemplary embodiment.

FIG. 8 is a block diagram of an exemplary semiconductor apparatus 3000A that includes the first and second chip stacks 3200_a_ and 3200_b_. In one embodiment, the first and second chip stacks 3200_a_ and 3200_b_ each include 4 semiconductor chips, similar to the semiconductor apparatus 3000A shown in FIG. 7A.

Referring to FIGS. 7A and 8, the first chip stack 3200_a_ may include a first interface circuit area Interface 1 and a first cell area Cell 1. The second chip stack 3200_b_ may include a second interface circuit area Interface 2 and a second cell area Cell 2. A detailed configuration of the semiconductor apparatus 3000A is described with reference to the first chip stack 3200_a_. The second chip stack 3200_b_ may have a similar configuration and operation as first chip stack 3200_a_.

The first interface circuit area Interface 1 may be included in the first semiconductor chip 3210_a_ of the first chip stack 3200_a_. The first cell area Cell 1 may be included in each of the first, second, third, and fourth semiconductor chips 3210_a_, 3220_a_, 3230_a_, and 3240_a_. In one embodiment, the first semiconductor chip 3210_a_ is a master chip. As a master chip, the first semiconductor chip 3210_a_ may or may not include a memory cell. In the embodiment depicted in FIG. 8, the first semiconductor chip 3210_a_ includes a memory cell. The first cell area Cell 1 may include a cell array, a row address decoder, a column address decoder, and a sense amplifier array. The first interface circuit area Interface 1 may include various kinds of peripheral circuits for a memory operation, e.g., a command decoder, an address register, a bank controller, an input/output driver/sense amplifier, and an input/output buffer. The peripheral circuits disposed in the first interface circuit area Interface 1 may be shared by the first, second, third, and fourth semiconductor chips 3210_a_, 3220_a_, 3230_a_, and 3240_a_.

A command CMD, an address ADDR, and data DQ may be simultaneously supplied to the first and second chip stacks 3200_a_ and 3200_b_ via one or more second bonding terminals of the second bonding terminal group 3120. The command CMD, the address ADDR, and the data DQ delivered to the first semiconductor chip 3210_a_ may be forwarded to the second to fourth semiconductor chips 3220_a_, 3230_a_, and 3240_a_ via the first to third through-vias. A chip select signal may be separately supplied to the first or second chip stacks 3200_a_ or 3200_b_ via the first or second chip select terminal 3112 or 3114.

In the embodiment shown in FIG. 8, any one of the first and second chip stacks 3200_a_ and 3200_b_ may be selected via the first or second chip select terminal 3112 or 3114, and a command/address signal may be delivered to a plurality of chips via through-vias formed in the selected first or second chip stack 3200_a_ or 3200_b_. Each of the plurality of chips in the selected chip stack may record or read data in response to the command/address signal. For example, the read data may be provided to a chip in which a corresponding interface circuit area is disposed via the through-vias and then provided to the outside via an output buffer (not shown).

In another embodiment, the first semiconductor chip 3210_b_ is an interface chip. As an interface chip, the first semiconductor chip 3210_b_ may not include a bank 0. In another embodiment, the first semiconductor chip 3210_b_ may be a logic chip further including a memory control circuit besides the first interface circuit area Interface 1. In another embodiment, the first chip stack 3200_a_ may include chips of a kind different from those of the second chip stack 3200_b_.

Figure 9:
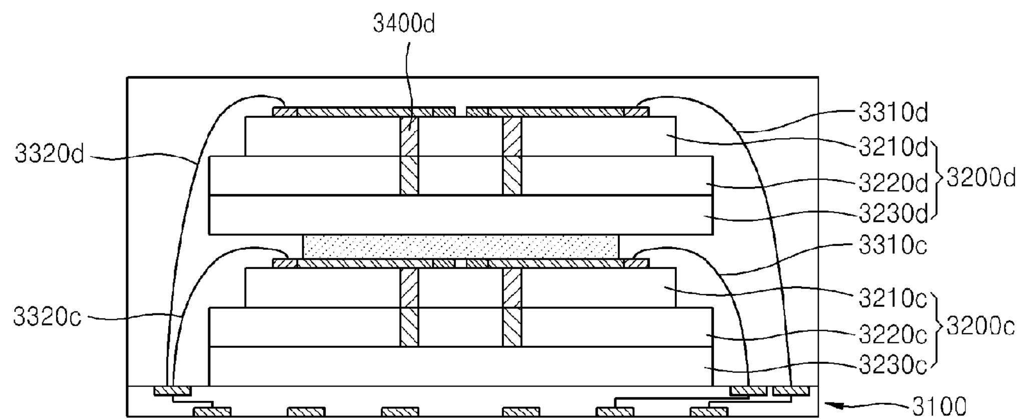
FIG. 9 is a cross-sectional view of a semiconductor apparatus according to an exemplary embodiment.

FIG. 9 is a cross-sectional view of a semiconductor apparatus 3000B according to an exemplary embodiment. The semiconductor apparatus 3000B may include a configuration similar to that of the semiconductor apparatus 3000A of FIG. 7A. Hereinafter, a configuration different from that of the semiconductor apparatus 3000A of FIG. 7A is mainly described.

Referring to FIG. 9, the semiconductor apparatus 3000B may include first and second chip stacks 3200_c_ and 3200_d_ mounted on the substrate 3100. Each of the first and second chip stacks 3200_c_ and 3200_d_ may include a plurality of semiconductor chips. One or more of the plurality of semiconductor chips may be different kinds of chips and/or may have different sizes.

The second chip stack 3200_d_ may include first to third semiconductor chips 3210_d_, 3220_d_ and 3230_d_. The third to first semiconductor chips 3230_d_, 3220_d_ and 3210_d_ may be sequentially stacked on the substrate 3100. The first semiconductor chip 3210_d_ may be disposed at the uppermost position of the second chip stack 3200_d_ and connected to the substrate 3100 via first and second bonding wires 3310_d_ and 3320_d_. In one embodiment, the first semiconductor chip 3210_d_ may be an interface chip including a circuit to interface with the outside, to receive a chip select signal via the first bonding wire 3310_d_ and to receive a signal and/or power from the outside via the second bonding wire 3320_d_. The second and third semiconductor chips 3220_d_ and 3230_d_ may include a memory core and transmit and receive a signal to and from the first semiconductor chip 3210_d_ via a through-via 3400_d_. The interface chip may not include a memory cell and may be smaller than the core chip.

In one embodiment, the first chip stack 3200_c_ may be implemented to be different from the second chip stack 3200_d_. In one embodiment, the first chip stack 3200_c_ may include the same or a different number of chips from those of the second chip stack 3200_d_. The first chip stack 3200_c_ may include chips that each have the same size. In one embodiment, the activation surface of each chip may be implemented in a different method, and a through-via may be disposed in the lowest chips, namely, the core chip 3230_c_ and the third semiconductor chip 3230_d_, of the first and second chip stacks 3200_c_ and 3200_d_.

Figure 10:
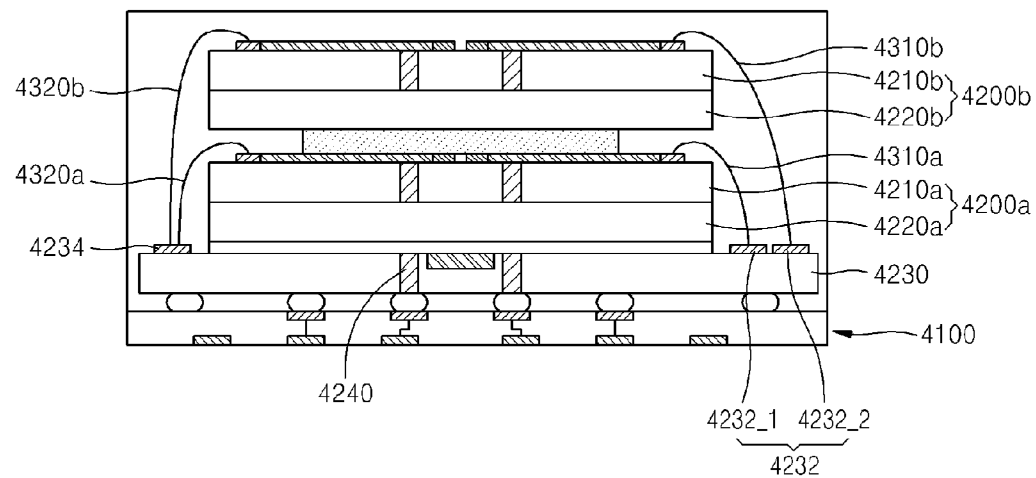
FIG. 10 is a cross-sectional view of a semiconductor apparatus according to an exemplary embodiment.

FIG. 10 is a cross-sectional view of a semiconductor apparatus 4000 according to one example. The semiconductor apparatus 4000 may include a configuration that is substantially the same as that of the semiconductor apparatus 1000B of FIG. 3A. Hereinafter, a configuration different from that of the semiconductor apparatus 1000B of FIG. 3A is mainly described.

Referring to FIG. 10, the semiconductor apparatus 4000 may include a semiconductor chip mounted on a substrate 4100 and at least two chip stacks stacked on the semiconductor chip. In one embodiment, first and second chip stacks 4200_a_ and 4200_b_, each including a plurality of semiconductor chips, may be stacked on a third semiconductor chip 4230. First chip stack 4200_a_ may include a first semiconductor chip 4210_a_ and a second semiconductor chip 4220_a_ electrically connected to each other via a through-via. Second chip stack 4200*b* may be implemented substantially the same as first chip stack 4200*a*. In one embodiment, the first and second chip stacks 4200*a* and 4200*b* may correspond to the first and second chip stacks 1200*c* and 1200*d* of FIG. 3A, respectively, and the first and second semiconductor chips 4210*a* and 4220*a* may have substantially the same configuration as the upper and lower chips 1210*c* and 1230*c* of FIG. 3A, respectively.

The first and second chip stacks 4200*a* and 4200*b* may be stacked on one surface of the third semiconductor chip 4230. In one embodiment, the third semiconductor chip 4230 may be a master chip, and all the semiconductor chips in the first and second chip stacks 4200*a* and 4200*b* may be slave chips. The third semiconductor chip 4230 may include first and second bonding pad groups 4232 and 4234 on the surface thereof. The first bonding pad group 4232 may include one or more chip select pads, and the second bonding pad group 4234 may include one or more bonding pad for transmitting a control signal and/or a data signal. Although the third semiconductor chip 4230 may be mounted in a face-up orientation and electrically connected to the substrate 4100 via a through-via 4240, as shown in FIG. 10, the third semiconductor chip 4230 is not limited to the examples described herein and may be mounted in various forms. For example, the third semiconductor chip 4230 may be mounted in a face-up orientation and electrically connected to the substrate 4100 via a wire. As another example, the third semiconductor chip 4230 may be mounted in a face-down orientation.

The first and second chip stacks 4200*a* and 4200*b* may be stacked on the third semiconductor chip 4230 and connected to the third semiconductor chip 4230 via a conductive means. The first chip stack 4200*a* may be connected to a first bonding pad 4232_1 via a first bonding wire 4310*a* and connected to the second bonding pad 4234 via a second bonding wire 4320*a*. The second chip stack 4200*b* may be connected to a first bonding pad 4232_2 via a first bonding wire 4310*b* and connected to the second bonding pad 4234 via a second bonding wire 4320*b*. The first and second chip stacks 4200*a* and 4200*b* may be connected to the third semiconductor chip 4230 via the first bonding wires 4310*a* and 4310*b* and the second bonding wires 4320*a* and 4320*b*, respectively, and may communicate with the outside via the third semiconductor chip 4230 and the substrate 4100. Although the first bonding pads 4232_1 and 4232_2 for chip selection are depicted as separated to correspond with the first and second chip stacks 4200*a* and 4200*b*, a shared bonding pad for chip selection may also be used. Similarly, although the second bonding pad 4234 is shown as a shared bonding pad, multiple dedicated bonding pads that are separated to correspond with each chip stack may be used. In one embodiment, three or more chip stacks including slave chips may be stacked on the third semiconductor chip 4230.

Figure 11:
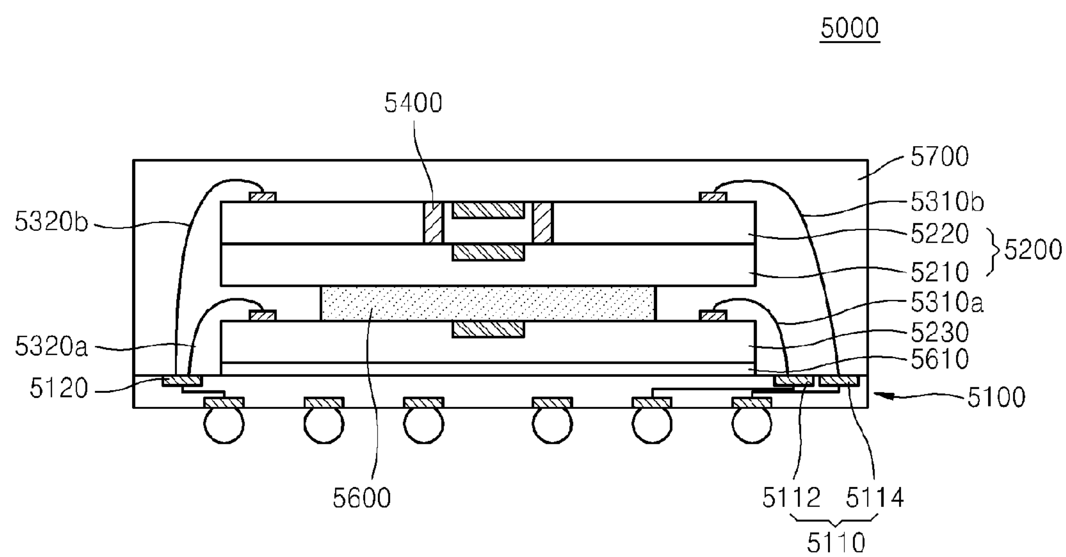
FIG. 11 is a cross-sectional view of a semiconductor apparatus according to an exemplary embodiment.

FIG. 11 is a cross-sectional view of a semiconductor apparatus 5000 according to one example. Referring to FIG. 11, the semiconductor apparatus 5000 may include a third semiconductor chip 5230 and a chip stack 5200 stacked on a substrate 5100. The chip stack 5200 may include first and second semiconductor chips 5210 and 5220 connected to each other via a through-via 5400. The chip stack 5200 may correspond to the first or second chip stack 1200*a* or 1200*b* of FIG. 1A, and the substrate 5100, a spacer 5600, and a molding part 5700 may include a configuration that is substantially the same as that of the substrate 1100, the spacer 1600, and the molding part 1700 of FIG. 1A. Although the chip stack 5200 is stacked on the third semiconductor chip 5230, the position of the chip stack 5200 is not limited to the examples described herein. For example, the third semiconductor chip 5230 may be stacked on the chip stack 5200. When the third semiconductor chip 5230 is stacked on the chip stack 5200, the spacer 5600 may be disposed between the second semiconductor chip 5220 and the third semiconductor chip 5230. A configuration different from that of the semiconductor apparatus 1000A of FIG. 1A is described.

The third semiconductor chip 5230 may operate independently. The third semiconductor chip 5230 may be substantially the same as the upper chip 1210*a* of the first chip stack 1200*a* shown in FIG. 1A. The third semiconductor chip 5230 may be connected to a first chip select terminal 5112 via a first bonding wire 5310*a* and connected to a second bonding terminal 5120 via a second bonding wire 5320*a*. The third semiconductor chip 5230 may share the second bonding terminal 5120 with the chip stack 5200. In addition, the chip stack 5200 may be connected to a separate chip select terminal 5114 via a first bonding wire 5310*b* to control a chip stack selection. The third semiconductor chip 5230 may be a logic chip but is not limited thereto.

When the third semiconductor chip 5230 is mounted in a face-up orientation, the third semiconductor chip 5230 may be attached to the substrate 5100 by using an adherent layer 5610 and may be electrically connected to the substrate 5100 via the first and second bonding wires 5310*a* and 5320*a*. Although not shown, when the third semiconductor chip 5230 is mounted in a face-down orientation, the third semiconductor chip 5230 may be mounted in a flip-chip method.

Although only one third semiconductor chip 5230 is shown in FIG. 11, the semiconductor apparatus 5000 may include a plurality of third semiconductor chips 5230, and the kinds, number, and mounting methods of the third semiconductor chips 5230 are not limited to the above description and may vary.

Figure 12:
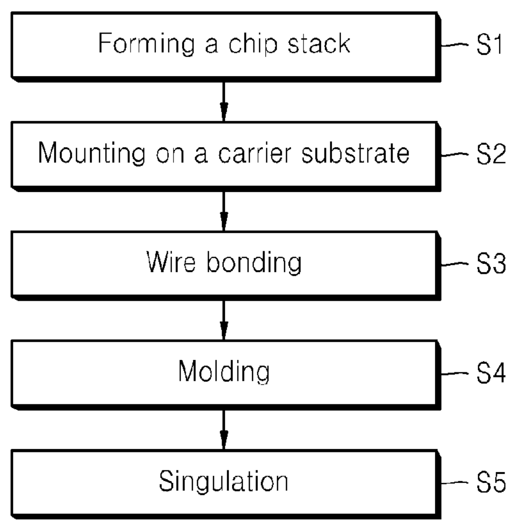
FIG. 12 is a flowchart of a method of fabricating a semiconductor apparatus, according to an exemplary embodiment.

FIG. 12 is a flowchart of an exemplary method of fabricating a semiconductor apparatus. The semiconductor apparatuses described above according to various embodiments may be fabricated in various methods. Referring to FIG. 12, the method of fabricating a semiconductor apparatus may include forming a chip stack (operation S1), mounting the chip stack on a substrate (operation S2), connecting the chip stack and the substrate with a wire (operation S3), forming a molding part (operation S4), and singulating an individual semiconductor apparatus (operation S5). For convenience of description, a method of fabricating the semiconductor apparatus 1000A of FIG. 1A is described as an example.

Figure 13A:
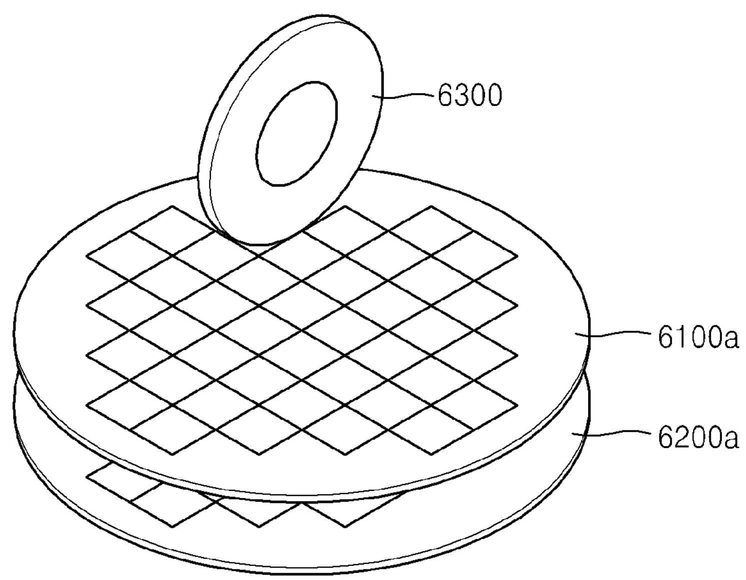
FIGS. 13A to 13C are perspective views and a cross-sectional view for describing a method of fabricating a chip stack, according to an exemplary embodiment.
Figure 13B:
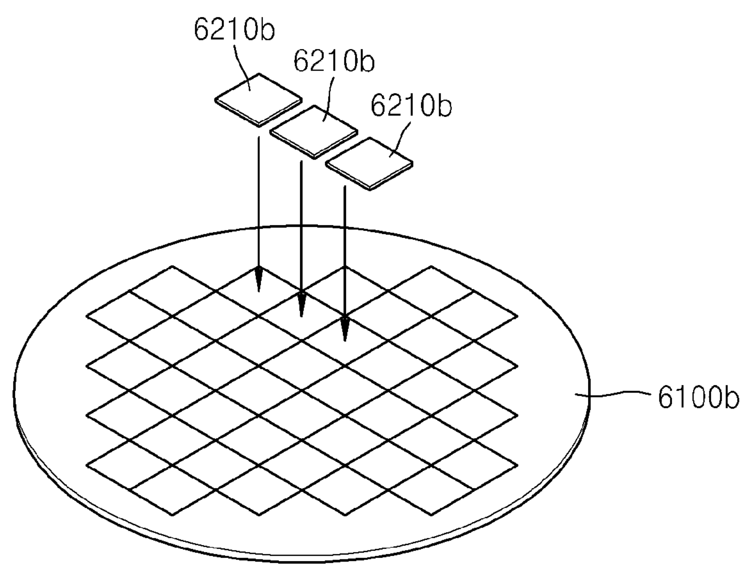
Figure 13C:
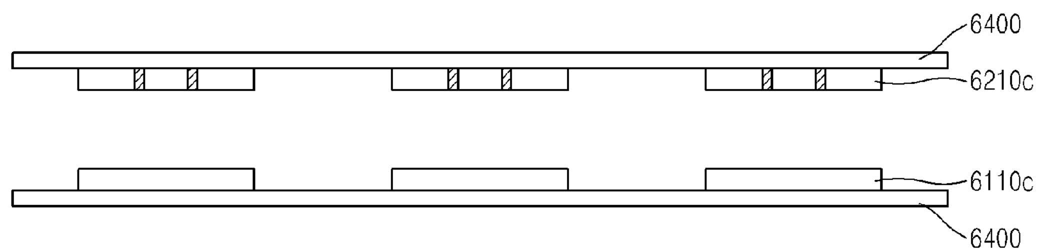

As shown in FIGS. 13A to 13C, a chip stack may be formed in various methods.

Referring to FIG. 13A, a chip stack is formed by stacking at least two layers of semiconductor wafers. The number of stacked semiconductor wafers may be the same as the number of semiconductor chips in a single chip stack. The number of stacked semiconductor wafers may be determined by using a manufacturing yield, such as an assembly throughput.

First and second semiconductor wafers 6100*a* and 6200*a* may be provided. Semiconductor devices, including the integrated circuit, namely, the circuit part 1213*b*, and the internal wiring pattern 1222, may be formed in the first and second semiconductor wafers 6100*a* and 6200*a*. The semiconductor devices formed in the first and second semiconductor wafers 6100*a* and 6200*a* may correspond to the upper and lower chips 1210*a* and 1230*a* of FIG. 1A, respectively. The first and second semiconductor wafers 6100*a* and 6200*a* may be attached to each other using an adherent layer (not shown).

The first and second semiconductor wafers 6100*a* and 6200*a* may be singulated to separate out individual chip stacks. The individual chip stacks may be the first and second chip stacks 1200*a* and 1200*b* of FIG. 1A. The singulation may be performed using a cutter 6300, a laser beam, or any other suitable method.

In an alternative embodiment, as shown in FIG. 13B, chip stacks may be formed by stacking individual semiconductor devices 6210*b* on a first semiconductor wafer 6100*b*. The individual semiconductor devices 6210*b* may be formed by singulating a second semiconductor wafer (not shown).

In an alternative embodiment, as shown in FIG. 13C, chip stacks may be formed by stacking individual semiconductor devices. A first semiconductor device 6110*c* and a second semiconductor device 6210*c* may be attached to each other using an adherent layer (not shown). For example, the second semiconductor device 6210*c* may be the upper chip 1210*a* of FIG. 1A and the first semiconductor device 6110*c* may be the lower chip 1230*a* of FIG. 1A.

The individual semiconductor devices may be attached to a supporting substrate 6400. The supporting substrate 6400 may be a tape or a glass, but is not limited to the examples described herein.

FIGS. 14A to 14E are cross-sectional views showing a packaging operation to form a semiconductor apparatus, according to an exemplary embodiment. The packaging operation may include mounting a chip stack formed by the method of FIG. 12 on a substrate (operation S2), connecting the chip stack and the substrate with a wire (operation S3), forming a molding part (operation S4), and singulating an individual semiconductor apparatus (operation S5). Hereinafter, a method of fabricating the semiconductor apparatus 1000A of FIG. 1A is described as an example.

Figure 14A:
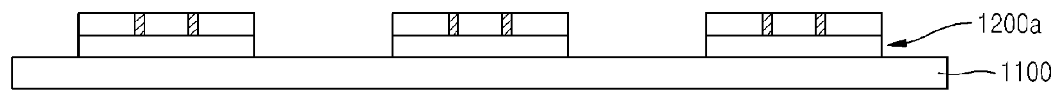
FIGS. 14A to 14E are cross-sectional views for describing a method of fabricating a semiconductor apparatus, according to an exemplary embodiment.
Figure 14B:
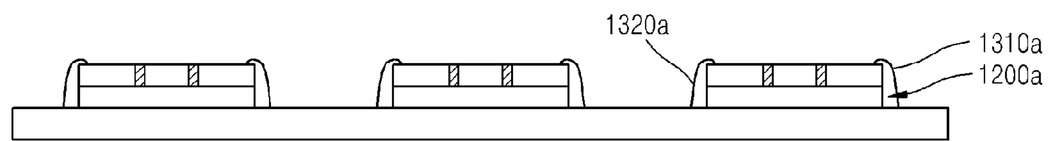

Referring to FIGS. 1A, 14A, and 14B, the first chip stack 1200*a* may be mounted on the substrate 1100 and may be connected to the substrate 1100 via a conductive means. For example, the first chip stack 1200*a* may be attached to the substrate 1100 by using an adherent layer (not shown), and the upper chip 1210*a* may be connected to the substrate 1100 via the bonding wires 1310*a* and 1320*a*.

Figure 14C:
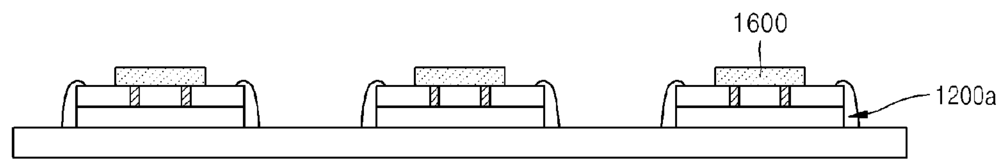

Referring to FIG. 14C, the spacer 1600 may be disposed on the first chip stack 1200*a*. The second chip stack 1200*b* may be stacked on the spacer 1600. In one embodiment, the spacer 1600 may include an adherent material, and the second chip stack 1200*b* may be fixed onto the first chip stack 1200*a* with the spacer 1600.

Figure 14D:
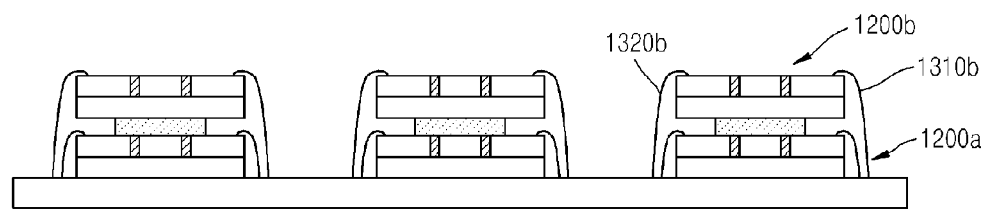

Referring to FIG. 14D, the second chip stack 1200*b* may be wire bonded to the substrate 1100. In one embodiment, the bonding wires 1310*b* and 1320*b* may be connected to the same bonding terminals to which the bonding wires 1310*a* and 1320*a* of the first chip stack 1200*a* are connected. In another embodiment, the bonding wires 1310*b* and 1320*b* may be connected to different bonding terminals.

Figure 14E:
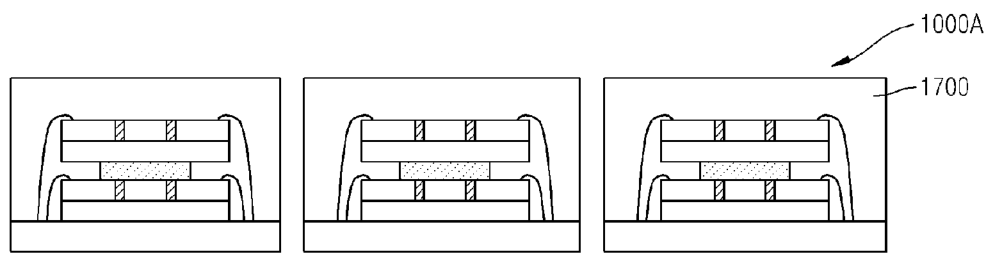

Referring to FIG. 14E, the molding part 1700 may be formed to cover at least a portion of the substrate 1100 and the first and second chip stacks 1200*a* and 1200*b*. Individual semiconductor apparatuses may be singulated, thereby forming the semiconductor apparatus 1000A as shown in FIG. 1A. The molding part 1700 may include, for example, an Epoxy Molding Compound (EMC) but is not limited to the examples described herein.

Figure 15A:
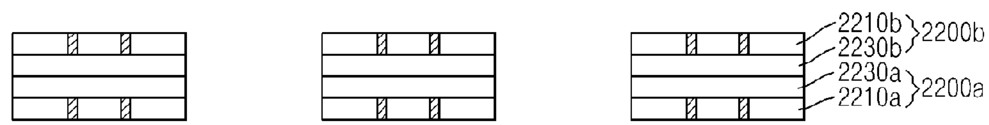
FIGS. 15A to 15C are cross-sectional views for describing a method of fabricating a semiconductor apparatus, according to an exemplary embodiment.
Figure 15B:
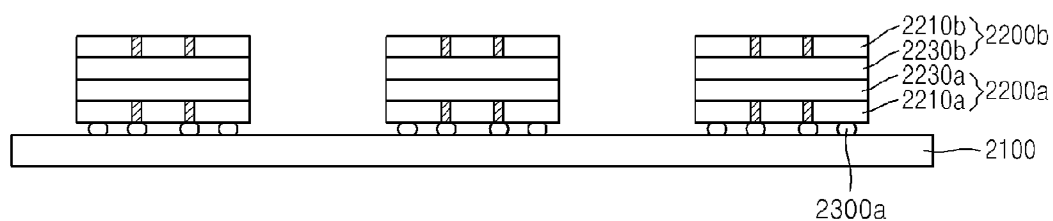
Figure 15C:
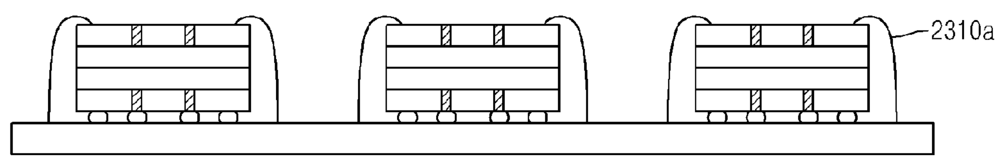

FIGS. 15A to 15C are cross-sectional views showing a packaging operation to form a semiconductor apparatus, according to an exemplary embodiment. An exemplary semiconductor apparatus fabricating method may be applied to fabricate, for example, the semiconductor apparatus 2000 of FIG. 5.

Referring to FIG. 15A, the first chip stack 2200*a* and the second chip stack 2200*b* may be stacked on each other. A stacking structure of the first chip stack 2200*a* and the second chip stack 2200*b* may be formed by sequentially stacking, in order, the first semiconductor chip 2210*a*, the second semiconductor chip 2230*a*, the fourth semiconductor chip 2230*b*, and the third semiconductor chip 2210*b*. Alternatively, the stacking structure may be formed by attaching the first chip stack 2200*a* and the second chip stack 2200*b* to each other after forming the first chip stack 2200*a* (in which the first semiconductor chip 2210*a* and the second semiconductor chip 2230*a* are stacked) and the second chip stack 2200*b* (in which the third semiconductor chip 2210*b* and the fourth semiconductor chip 2230*b* are stacked).

Referring to FIG. 15B, the stacking structure of the first chip stack 2200*a* and the second chip stack 2200*b* are mounted on the substrate 1100. The first conductive contact 2300*a*, disposed between the first chip stack 2200*a* and the substrate 1100, may be attached to the first chip stack 2200*a* and/or the substrate 1100. In one embodiment, the bonding of the first chip stack 2200*a* and the substrate 1100 using the first conductive contact 2300*a* is performed in a thermocompression bonding method. The type of bonding method is not limited to the examples described herein.

The method of mounting the first and second chip stacks 2100*a* and 2100*b* is not limited to the description above and may be performed by mounting the first chip stack 2200*a* on the substrate 1100 and then stacking the second chip stack 2200*b* on the first chip stack 2200*a* or by other suitable methods. In another embodiment, the first chip stack 2200*a* and the second chip stack 2200*b* may be stacked horizontally on the substrate.

Referring to FIG. 15C, the second conductive contact 2300*b* for connecting the second chip stack 2200*b* and the substrate 1100 is formed. In one embodiment, the second conductive contact 2300*b* may be formed via wire-bonding.

Thereafter, in a manner similar to that depicted in FIG. 14E, the semiconductor apparatus 2000, as shown in FIG. 5, may be formed by forming the molding part 1700 and singulating individual semiconductor apparatuses.

Figure 16:
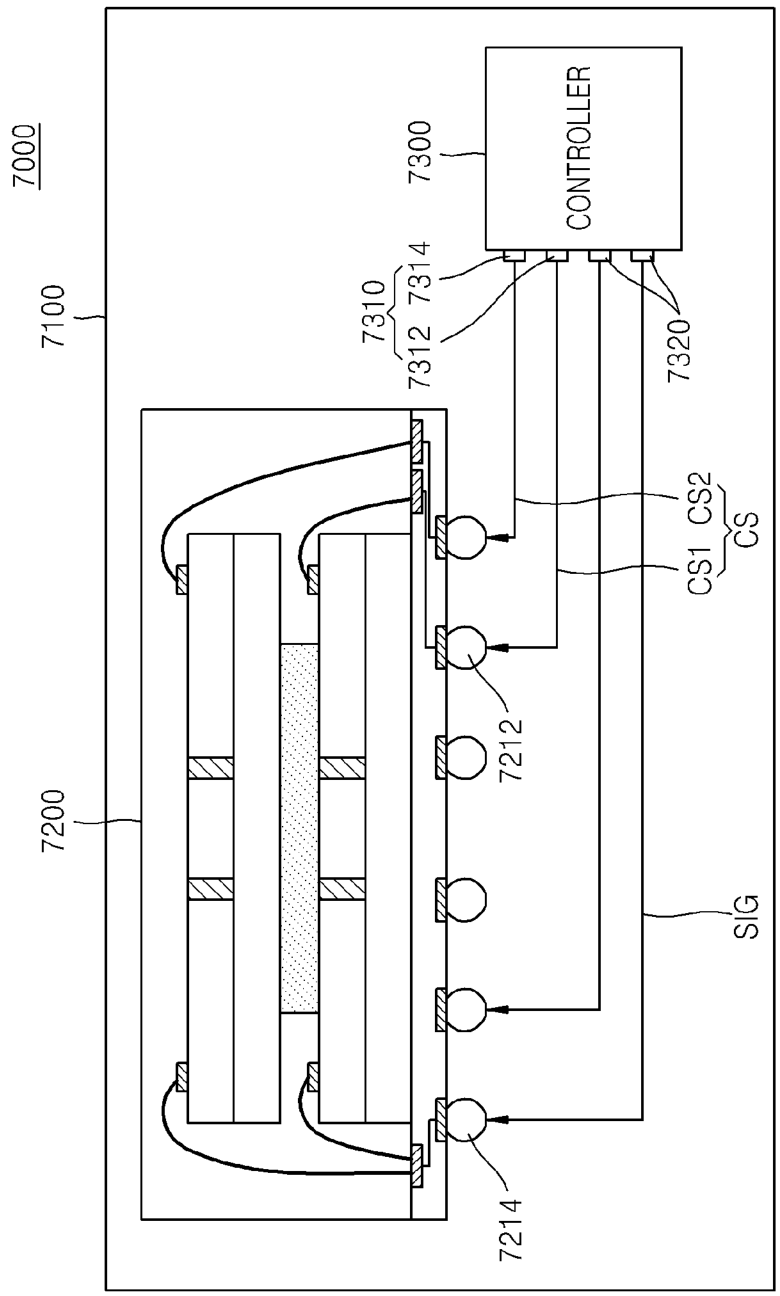
FIG. 16 is a block diagram of a semiconductor system according to an exemplary embodiment.

FIG. 16 is a block diagram of an exemplary semiconductor system 7000. Referring to FIG. 16, an example semiconductor system 7000 includes a system board 7100, a semiconductor apparatus 7200, and a controller 7300. The semiconductor apparatus 7200 may include a semiconductor apparatus according to various exemplary embodiments. The semiconductor apparatus 7200 may be packaged, mounted on the system board 7100, and electrically connected to the system board 7100 via an external access contact formed on the outer surface of the package. The semiconductor apparatus 7200 may be electrically connected to the controller 7300 via a wiring line on the system board 7100 that is connected to the external access contact. The semiconductor apparatus 7200 may have substantially the same configuration as the semiconductor apparatus 1000A in FIG. 1A.

In one embodiment, the controller 7300 includes a plurality of ports for supplying signals and/or power required to operate the semiconductor apparatus 7200. For example, the controller 7300 includes a first stack of ports 7310 for providing a chip select signal CS, and a second stack of ports 7320 for providing a control signal and/or a data signal SIG. The semiconductor apparatus 7200 may be connected to the plurality of ports of the controller 7300 via the external access contact. For example, the semiconductor apparatus 7200 may include a first stack of external access contacts 7212 connected to the first stack of ports 7310 (e.g., a first select port 7312 for providing a first chip select signal CS1 and a second select port 7314 for providing a second chip select signal CS2) to receive the chip select signal CS and a stack of second external access contacts 7214 connected to the second stack of ports 7320 to receive the control signal and/or the data signal SIG.

For example, the first select port 7312 may be connected to the first chip select terminal 1112 (see FIG. 1A) via the first external access contact 7212 to provide the first chip select signal CS1 to the first chip stack 1200*a* (see FIG. 1A). The second stack of ports 7320 may include a plurality of ports connected to the second bonding terminal 1120 (see FIG. 1A) via the second external access contact 7214 to provide the control signal and/or the data signal SIG to the first and second chip stacks 1200*a* and 1200*b* (see FIG. 1A).

By using an exemplary semiconductor apparatus and increasing the number of semiconductor chips in the single semiconductor apparatus 7200, a stable connection between the semiconductor chips may be achieved. A high-capacity semiconductor system may be implemented.

Figure 17:
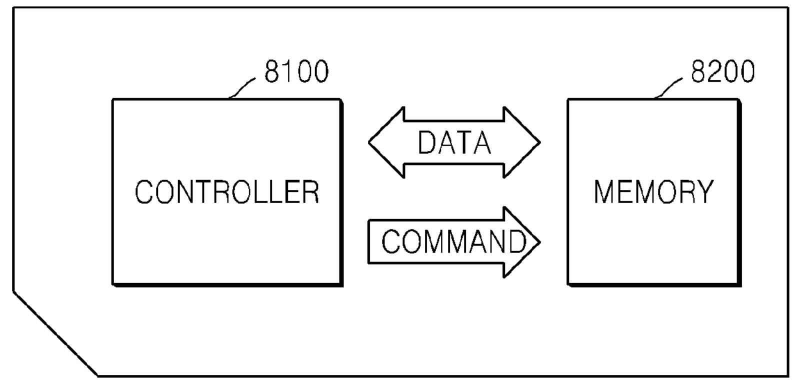
FIG. 17 is a diagram of a memory card according to an exemplary embodiment.

FIG. 17 is a diagram of a memory card 8000 according to one example. The semiconductor system 7000 shown in FIG. 16 may be applied to the memory card 8000. For example, a memory 8200 and a controller 8100 may transmit and receive data to and from each other according to a command of the controller 8100. Accordingly, the memory card 8000 may store data in the memory 8200 or output data from the memory 8200 to the outside.

The controller 8100 and the memory 8200 may correspond to the controller 7300 and the semiconductor apparatus 7200 shown in FIG. 16, respectively. The memory card 8000 may be used as a data storage medium for portable devices. For example, the memory card 8000 may include a multimedia card (MMC) or a secure digital (SD) card. The semiconductor system 7000 of FIG. 16 may be applied to mobile phones, portable game machines, laptop computers, MP3 players, navigation devices, vehicles, and household appliances, among others.

Figure 18:
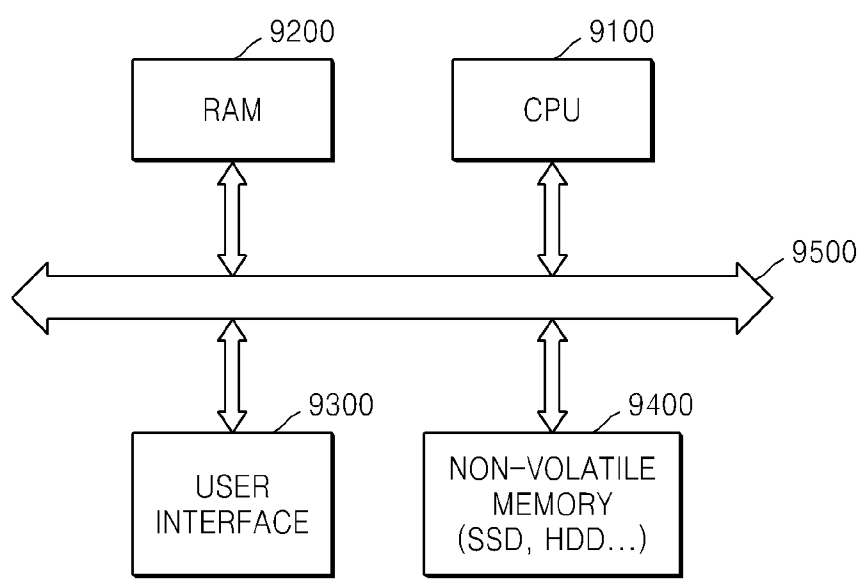
FIG. 18 is a block diagram of a computing system equipped with a memory system, according to an exemplary embodiment.

FIG. 18 is a block diagram of a computing system 9000 equipped with a memory system, according to one example. In one example, a memory device may be mounted as a Random Access Memory (RAM) 9200 in information processing systems, such as mobile devices and desktop computers. The embodiments described above may be applied to the memory device as the RAM 9200.

The computing system 9000 may include a Central Processing Unit (CPU) 9100, the RAM 9200, a user interface 9300, and a nonvolatile memory 9400, each of which is electrically connected to a bus 9500. A large-capacity storage device, such as a Solid-State Drive (SSD) or a Hard Disk Drive (HDD), may be used as the nonvolatile memory 9400.

In the exemplary computing system 9000, the RAM 9200 may include a plurality of chips in a stack structure. Each of the plurality of chips may include at least two regions (or at least two chip stacks). In one embodiment, each of the at least two chip stacks may include a Dynamic RAM (DRAM) cell for storing system data. In one embodiment, the chip stacks may include different kinds of memories. For example, when a first chip stack includes a DRAM cell for storing system data, the system data may be stored in the first chip stack. When a second chip stack includes a memory cell (e.g., a flash memory cell or a nonvolatile memory such as a Resistive RAM (RRAM) or a Parameter RAM (PRAM)) for storing data except for the system data, data stored in an SSD or an HDD in the past may be stored in the second chip stack.

The capacity of the RAM 9200 used in the computing system 9000 may increase and chip stacks having different kinds of memories may be stacked. System data and the other data may be stored in the RAM 9200. An operation speed of the CPU 9100 for reading data may increase. The computing system 9000 may be mounted in desktop computers, laptop computers, and mobile devices such as cellular phones.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A semiconductor device comprising:

a substrate including at least a first conductive terminal disposed at a first surface of the substrate and a second conductive terminal disposed at the first surface of the substrate;

at least a first set of two or more chips and a second set of one or more chips;

the first set of two or more chips comprising:

a plurality of semiconductor chips including at least a first chip stacked on a second chip, the first chip including at least a first conductive terminal disposed at a first surface of the first chip;

the second set of one or more chips comprising:

one or more semiconductor chips including at least a third chip, the third chip including at least a first conductive terminal disposed at a first surface of the third chip;

a first node including the first conductive terminal of the first chip, the first conductive terminal of the substrate, and a bonding wire disposed between the two conductive terminals;

a first through via passing through at least part of the first chip and electrically connected to the first node and the second chip;

a second node including the first conductive terminal of the third chip, the second conductive terminal of the substrate, and a first conductive contact disposed between the two conductive terminals, wherein the first set of chips and second set of chips are mounted on the substrate such that the first set of chips is stacked on the second set of chips, wherein the first conductive terminal of the substrate is a chip select terminal dedicated to the first set of two or more chips and for selecting the first set of two or more chips, and wherein the second conductive terminal of the substrate is a control signal terminal, data terminal, or power terminal, shared among the first set of chips and the second set of chips.

2. The semiconductor device of claim 1, wherein the second set of one or more chips comprises:

a fourth chip; and a second through via passing through at least part of the third chip and electrically connected to the second node and the fourth chip.

3. The semiconductor device of claim 1, wherein the first conductive contact comprises a bonding wire.

4. The semiconductor device of claim 1, wherein the first conductive contact comprises a conductive bump, ball or spacer.

5. The semiconductor device of claim 1, wherein the second chip does not include a conductive contact directly connected to a substrate or chip external to the first set of chips.

6. The semiconductor device of claim 1, further comprising:

a spacer disposed between the first set of chips and the second set of chips.

7. The semiconductor device of claim 1, wherein the first set of chips is not electrically connected to communicate with the second set of chips.

8. The semiconductor device of claim 1, wherein the substrate includes a plurality of chip select terminals, and the total number of chip select terminals on the substrate is less than the total number of chips included in the semiconductor device.

9. The semiconductor device of claim 8, wherein:

the first chip select terminal is configured to transmit a signal to select the first set of two or more chips, and further comprising: a third node including a second conductive terminal of the third chip, a third conductive terminal of the substrate, and a third conductive contact disposed between the two conductive terminals, wherein the third conductive terminal of the substrate is a chip select terminal dedicated to the second set of one or more chips and for selecting the second set of one or more chips, and the second chip select terminal is configured to transmit a signal to select the second set of one or more chips.

10. A semiconductor device comprising:

a substrate;

at least a first stack of two or more chips and a second stack of two or more chips mounted on the substrate;

the first stack of two or more chips comprising:

at least a first semiconductor chip configured to receive signals directly from the substrate; and at least a second semiconductor chip configured to receive signals transmitted from the substrate indirectly through the first semiconductor chip;

the second stack of two or more chips comprising:

at least a third semiconductor chip configured to receive signals directly from the substrate; and at least a fourth semiconductor chip configured to receive signals transmitted from the substrate indirectly through the third semiconductor chip, wherein the second stack of chips is disposed on a first surface of the substrate, and the first stack of chips is mounted on the second stack of chips, and wherein the substrate includes a first conductive terminal that is a chip select terminal dedicated to the first stack of chips and configured to select the first stack of chips, and includes a second conductive terminal that is a chip select terminal dedicated to the second stack of chips and configured to select the second stack of chips.

11. The semiconductor device of claim 10, wherein the first semiconductor chip is configured to receive signals directly from the substrate via a bonding wire.

12. The semiconductor device of claim 11, further comprising a first through-via disposed in the first semiconductor chip, wherein the first through-via is electrically connected to the bonding wire, and the second semiconductor chip is configured to receive signals transmitted from the substrate indirectly through the first through-via of the first semiconductor chip.

13. The semiconductor device of claim 10, further comprising:

a first through-via disposed in the third semiconductor chip, wherein the fourth semiconductor chip is configured to receive signals transmitted from the substrate indirectly through the first through-via of the third semiconductor chip.

14. The semiconductor device of claim 10, wherein the first chip is a master chip and the second chip is a slave chip.

15. The semiconductor device of claim 10, wherein the first chip includes an interface circuit and the second chip includes a core circuit.

16. The semiconductor device of claim 10, wherein the first chip and the second chip are disposed such that an activation surface of the first chip faces an activation surface of the second chip.

17. The semiconductor device of claim 10, further comprising:

a fifth semiconductor chip mounted on the substrate and directly connected to the substrate, wherein the second set of chips is disposed on the fifth semiconductor chip.

18. A semiconductor device, comprising:

a substrate including at least a first chip select terminal disposed at a first surface of the substrate and a second chip select terminal disposed at the first surface of the substrate;

at least a first set of two or more chips and a second set of one or more chips;

the first set of two or more chips comprising:

a plurality of semiconductor chips including at least a first chip stacked on a second chip, the first chip including at least a first conductive terminal disposed at a first surface of the first chip;

the second set of one or more chips comprising:

one or more semiconductor chips including at least a third chip, the third chip including at least a first conductive terminal disposed at a first surface of the third chip;

a first conductive contact connecting the first conductive terminal of the first chip to the first chip select terminal of the substrate;

a first through via passing through at least part of the first chip and electrically connected to the first conductive contact and the second chip;

a second conductive contact connecting the first conductive terminal of the third chip to the second chip select terminal of the substrate, wherein the first set of chips and the second set of chips are mounted on the substrate such that the first set of chips is stacked on the second set of chips, wherein the first chip select terminal is configured to transmit a signal to select the first set of chips, and wherein the second chip select terminal is configured to transmit a signal to select the second set of chips.

19. The semiconductor device of claim 18, wherein the total number of chip select terminals disposed at the substrate is less than the total number of chips in the semiconductor device.

20. The semiconductor device of claim 19, wherein the first set of two or more chips comprises a first chip stack and the second set of one or more chips comprises a second chip stack, and the total number of chip select terminals disposed at the substrate is the same as the number of chip stacks included in the semiconductor device.

* * * * *